(12) United States Patent
Kim et al.

(10) Patent No.: US 12,262,589 B2
(45) Date of Patent: Mar. 25, 2025

(54) PIXEL AND DISPLAY DEVICE COMPRISING THE SAME

(71) Applicant: SAMSUNG DISPLAY CO., LTD., Yongin-si (KR)

(72) Inventors: Keunwoo Kim, Yongin-si (KR); Hyena Kwak, Yongin-si (KR); Sangsub Kim, Yongin-si (KR); Hanbit Kim, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 17/079,765

(22) Filed: Oct. 26, 2020

(65) Prior Publication Data
US 2021/0335953 A1    Oct. 28, 2021

(30) Foreign Application Priority Data

Apr. 23, 2020  (KR) .................. 10-2020-0049482

(51) Int. Cl.
*H10K 59/121*     (2023.01)
*G09G 3/3233*     (2016.01)
(Continued)

(52) U.S. Cl.
CPC ....... *H10K 59/1213* (2023.02); *G09G 3/3233* (2013.01); *G09G 3/3266* (2013.01);
(Continued)

(58) Field of Classification Search
CPC ............. H01L 27/3262; H01L 27/3265; H01L 27/3276; G09G 3/3233; G09G 3/3266; G09G 3/3275
See application file for complete search history.

(56) References Cited

U.S. PATENT DOCUMENTS 8,441,421 B2 * 5/2013 Han ................... G09G 3/3233
345/82
9,746,723 B2    8/2017 Yang et al.
(Continued)

FOREIGN PATENT DOCUMENTS

CN    107316613    11/2017
CN    108154846    6/2018
(Continued)

OTHER PUBLICATIONS

English Translation of CN 107316613 (Year: 2017).*

*Primary Examiner* — Patrick N Edouard
*Assistant Examiner* — Eboni N Giles
(74) *Attorney, Agent, or Firm* — F. Chau & Associates, LLC

(57) ABSTRACT

A pixel includes: a driving transistor including a semiconductor layer and a gate electrode; and a compensation transistor connected to the gate electrode and the semiconductor layer of the driving transistor, wherein the first thin-film transistor includes: a first sub-transistor including a first gate electrode receiving a first scan signal having a first voltage level during a period; and a second sub-transistor connected to the first sub-transistor in parallel and comprising a second gate electrode receiving a second scan signal having a second voltage level that is an inverted level of the first voltage level during the same period.

19 Claims, 20 Drawing Sheets

(51) Int. Cl.
*G09G 3/3266* (2016.01)
*G09G 3/3275* (2016.01)
*H10K 59/131* (2023.01)

(52) U.S. Cl.
CPC ....... *G09G 3/3275* (2013.01); *H10K 59/1216* (2023.02); *H10K 59/131* (2023.02)

(56) References Cited

U.S. PATENT DOCUMENTS

| | | | |
|---|---|---|---|
| 10,482,817 | B2 | 11/2019 | Kim et al. |
| 2005/0200618 | A1* | 9/2005 | Kim ................... G09G 3/3233 345/204 |
| 2012/0019503 | A1 | 1/2012 | Lee |
| 2013/0321376 | A1* | 12/2013 | Kim ................... G09G 3/3233 345/212 |
| 2014/0198136 | A1* | 7/2014 | Lee ................... G09G 3/3266 345/82 |
| 2014/0346968 | A1* | 11/2014 | Meng ................... H05B 45/60 315/240 |
| 2015/0249158 | A1* | 9/2015 | Cheng ............... H01L 29/42328 438/587 |
| 2019/0088731 | A1* | 3/2019 | Lee ................... H01L 29/78696 |
| 2019/0304373 | A1 | 10/2019 | Wang et al. |
| 2019/0340978 | A1 | 11/2019 | Cha et al. |
| 2019/0371237 | A1 | 12/2019 | Qian et al. |
| 2020/0082755 | A1 | 3/2020 | Kim et al. |
| 2021/0335235 | A1* | 10/2021 | Yang ................... G09G 3/3233 |

FOREIGN PATENT DOCUMENTS

| | | |
|---|---|---|
| CN | 109427301 | 3/2019 |
| KR | 10-2005-0090666 | 9/2005 |
| KR | 10-1151609 | 5/2012 |
| KR | 10-2014-0092574 | 7/2014 |
| KR | 10-2016-0092115 | 8/2016 |
| KR | 10-2019-0010058 | 1/2019 |
| KR | 10-2019-0033678 | 4/2019 |
| KR | 10-2004359 | 7/2019 |
| KR | 10-2019-0116597 | 10/2019 |
| KR | 10-2019-0126965 | 11/2019 |
| KR | 10-2019-0138586 | 12/2019 |

* cited by examiner

PIXEL AND DISPLAY DEVICE COMPRISING THE SAME

CROSS-REFERENCE TO RELATED APPLICATION

This U.S. non-provisional patent application claims the benefit of priority under 35 U.S.C. § 119 to Korean Patent Application No. 10-2020-0049482, filed on Apr. 23, 2020, in the Korean Intellectual Property Office, the disclosure of which is incorporated by reference in its entirety herein.

TECHNICAL FIELD

The present disclosure relates to a pixel and a display device including the same.

DISCUSSION OF RELATED ART

A display device such as a flat-panel display (FPD) is an electronic device used by people to view content (e.g., still/moving images). An FPD device is far lighter, thinner, and uses less power than a traditional cathode ray tube (CRT) device. The display device includes a plurality of pixels, where each pixel includes a display element and a pixel circuit for controlling an electrical signal transmitted to the display element. The pixel circuit may include one or more transistors. The transistors may include a compensation transistor and a driving transistor. However, under certain circumstances, the compensation transistor contributes to a kick back voltage occurring at a gate node of the driving transistor, which causes an afterimage to be perceived. Thus, the quality of images generated by a display device including the pixel circuit needs to be improved.

SUMMARY

At least one exemplary embodiment of the present disclosure provides a display device capable of preventing the appearance of afterimages.

According to an exemplary embodiment of the present disclosure, a pixel includes: a driving transistor including a semiconductor layer and a gate electrode; and a compensation transistor connected to the gate electrode and the semiconductor layer of the driving transistor. The compensation transistor includes: a first sub-transistor including a first gate electrode receiving a first scan signal having a first voltage level during a period; and a second sub-transistor connected to the first sub-transistor in parallel and including a second gate electrode receiving a second scan signal having a second voltage level that is an inversion of the first voltage level during the same period.

The first sub-thin-film transistor may be a P-channel thin-film transistor, and the second sub-thin-film transistor may be N-channel thin-film transistor.

The pixel may further include: a first scan line transmitting the first scan signal to the first sub-transistor and connected to the first sub-transistor; and a second scan line transmitting the second scan signal to the second sub-transistor and connected to the second sub-transistor, wherein the first and second scan lines extend in parallel with the driving transistor therebetween.

The pixel may further include: a first node electrode connecting the semiconductor layer of the first sub-transistor and the gate electrode of the driving transistor to each other; and a second node electrode connecting the semiconductor layer of the second sub-transistor and the gate electrode of the driving transistor to each other.

The pixel may further include a capacitor overlapping the driving transistor.

The pixel may further include a data line and a driving voltage line disposed on a same level as the first node electrode.

The driving transistor may include a P-channel thin-film transistor.

Each of the first sub-transistor and the second sub-transistor may include a semiconductor layer including silicon.

The first sub-transistor may include a semiconductor layer including silicon, and the second sub-transistor may include a semiconductor layer having an oxide.

The pixel may further include an initialization transistor connected to the gate electrode and an initialization voltage line of the driving transistor.

The initialization thin-film transistor may include a semiconductor layer including an oxide semiconductor.

According to an exemplary embodiment of the present disclosure, a pixel includes: a driving transistor including a semiconductor layer and a gate electrode; and a compensation transistor connected to the gate electrode and the semiconductor layer of the driving transistor. The compensation transistor includes: a first sub-transistor including a first gate electrode receiving a first scan signal having a first voltage level during a period and a second gate electrode receiving a second scan signal having a second voltage level that is an inversion of the first voltage level during the same period; and a second sub-transistor connected to the first sub-transistor in series and including a third gate electrode receiving the first scan signal.

The pixel may further include: a first scan line connected to the first gate electrode of the first sub-transistor and the third gate electrode of the second sub-transistor; and a second scan line connected to the second gate electrode of the first sub-transistor.

The second gate electrode may be disposed on a lower layer of the first gate electrode, and the third gate electrode may be disposed on a same layer as the first gate electrode.

The pixel may further include a capacitor overlapping the driving transistor.

The pixel may further include: a node electrode connecting the semiconductor layer of the compensation transistor and the gate electrode of the driving transistor to each other; and a data line and a driving voltage line disposed on a same layer as the node electrode.

According to an exemplary embodiment of the present disclosure, a display device includes a plurality of pixels, and each of the plurality of pixels includes: a driving transistor including a semiconductor layer and a gate electrode; and a compensation transistor connected to the gate electrode and the semiconductor layer of the driving transistor. The compensation transistor includes: a first sub-transistor including a first gate electrode receiving a first scan signal having a first voltage level; and a second sub-transistor including a second gate electrode that receives a second scan signal having a second voltage level that is inversion of the first voltage level during the same period.

The first sub-transistor and the second sub-transistor may be connected in parallel, the first sub-transistor may be a P-channel thin-film transistor, and the second sub-transistor may be an N-channel thin-film transistor.

The first sub-transistor may include a semiconductor layer including silicon, and the second sub-transistor may include a semiconductor layer including an oxide.

The display device may further include a third gate electrode receiving the first scan signal during the same period, wherein the third gate electrode may be disposed on a lower layer of the second gate electrode and a same layer as the first gate electrode.

According to an exemplary embodiment of the present disclosure, a pixel includes a driving transistor and a compensation transistor. The compensation transistor is connected to a gate electrode of the driving transistor. The compensation transistor includes first and second sub-transistors. The first sub-transistor includes first gate electrode receiving a first scan signal having a first logic level during a first period of a frame period and a second logic level different from the first logic level during a second period of the frame period. The second sub-transistor is connected to the first sub-transistor in parallel and includes a second gate electrode receiving a second scan signal having the second logic voltage level during the first period and the first logic level during the second period.

In an exemplary embodiment, the driving transistor further includes a semiconductor layer and the compensation transistor is further connected to the semiconductor layer of the driving transistor.

In an exemplary embodiment, one of the sub-transistors is a P-channel thin-film transistor and the other of the sub-transistors is an N-channel thin-film transistor.

BRIEF DESCRIPTION OF THE DRAWINGS

The above and other aspects, features, and elements of certain embodiments of the disclosure will be more apparent from the following description taken in conjunction with the accompanying drawings, in which.

DETAILED DESCRIPTION

Figure 1:
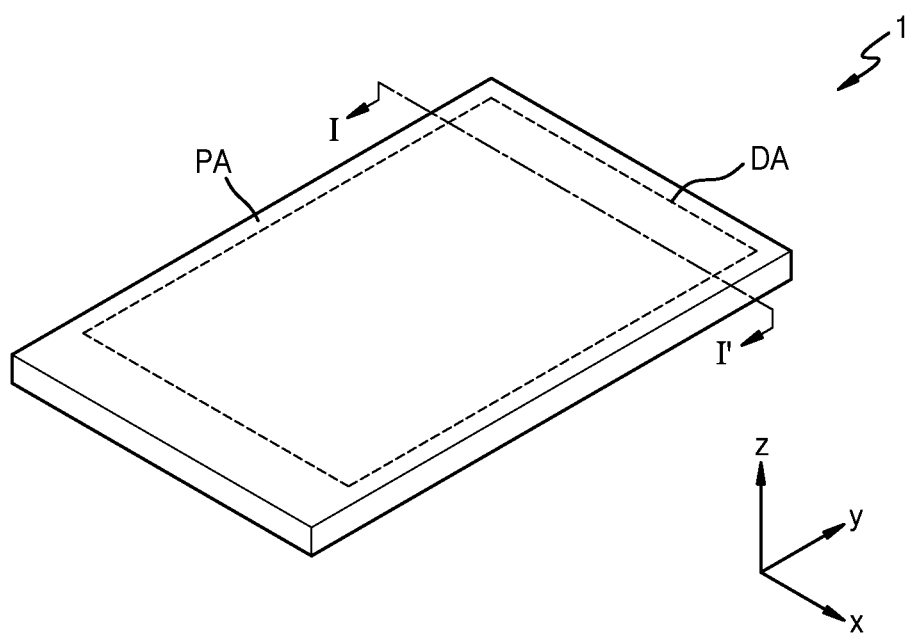
FIG. 1 is a schematic perspective view illustrating a display device according to an exemplary embodiment of the disclosure.

Reference will now be made in detail to exemplary embodiments of the present disclosure, examples of which are illustrated in the accompanying drawings. Like reference numerals refer to like elements throughout the drawings and the specification. In this regard, the present invention may have different forms and should not be necessarily construed as being limited to the descriptions set forth herein. Accordingly, several exemplary embodiments are described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, particular embodiments will be illustrated in the drawings and described in detail in the written description. The attached drawings for illustrating exemplary embodiments of the present disclosure are referred to for aiding the reader in understanding the present disclosure, the merits thereof, and objectives accomplished by the implementation of the present disclosure. The disclosure may, however, be embodied in many different forms and is not necessarily limited to the exemplary embodiments set forth herein.

It will be understood that although the terms "first," "second," etc. may be used herein to describe various elements, these elements should not necessarily be limited by these terms. These elements might only used to distinguish one element from another.

As used herein, the singular forms "a," "an" and "the" are intended to include the plural forms as well, unless the context clearly indicates otherwise.

It will be further understood that the terms comprises and/or comprising used herein specify the presence of stated features or elements, but do not preclude the presence or addition of one or more other features or elements.

It will be understood that when a layer, region, or element is referred to as being "formed on" another layer, region, or element, it can be directly or indirectly formed on the other layer, region, or element. For example, intervening layers, regions, or elements may be present.

Sizes of components in the drawings may be exaggerated for convenience of explanation. In other words, since sizes and thicknesses of elements in the drawings may be illustrated for convenience of explanation, the following embodiments are not necessarily limited thereto.

In the present disclosure, an expression such as "A and/or B" indicates A, B, or A and B. Also, an expression such as "at least one of A and B" indicates A, B, or A and B.

In embodiments described below, the description that lines extend "in a first direction or a second direction" includes that the lines extend in a straight line and includes that the lines extend in a zigzag shape or a curved line along a first direction or a second direction.

In embodiments below, when a element is referred to as being "on a plane," it is understood that a element is viewed from the top, and when a element is referred to as being "on a cross-section," it is understood that the element is vertically cut and viewed from the side. In embodiments below, when elements "overlap" each other, the elements overlap "on a plane" and "a cross-section."

In embodiments below, when X and Y are connected to each other, the connection may include an electrical connection, a functional connection, and a direct connection between X and Y. Here, X and Y may denote objects (e.g., apparatuses, devices, circuits, wires, electrodes, terminals, conductive films, layers, etc.). Therefore, such connections are not necessarily limited to certain connections, for example, connections in the drawings or the detailed description, and may include connections other than the aforementioned connections.

For example, when X and Y are electrically connected to each other, one or more devices (e.g., switches, transistors, capacitors, inductors, resistors, diodes, etc.) may exist between X and Y to enable the electrical connection therebetween.

In embodiments, the term "on" regarding a device state may refer to an active state of a device, and the term "off" may refer to an inactive state of a device. The term "on" used in relation to a signal received by a device may denote a signal for activating a device, and the term "off" may denote a signal for inactivating a device. A device may be activated according to a high-level voltage or a low-level voltage. For example, a P-channel transistor is activated according to a low-level voltage, and an N-channel transistor is activated according to a high-level voltage. Therefore, it should be construed that "on" voltages applied to the P-channel and N-channel transistors are opposite to each other (low vs. high).

Figure 2:
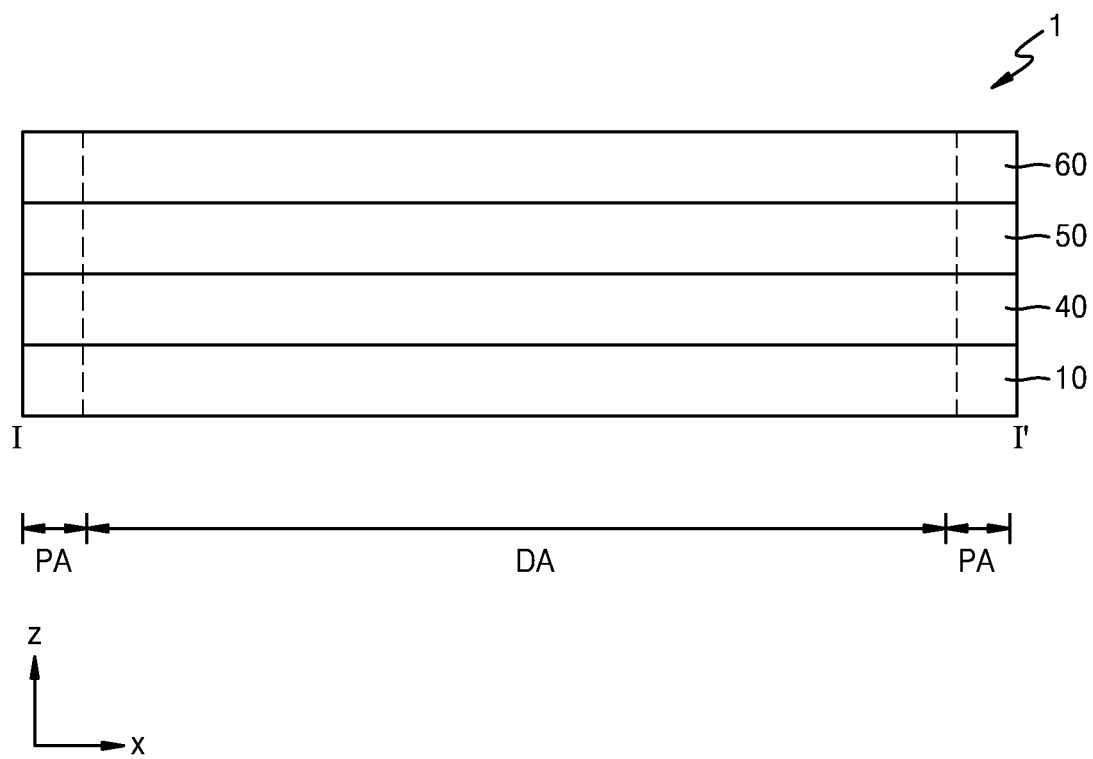
FIG. 2 is a schematic cross-sectional view illustrating a display device according to an exemplary embodiment of the disclosure.

FIG. 1 is a schematic perspective view of a display device according to an exemplary embodiment of the disclosure. FIG. 2 is a schematic cross-sectional view of a display device according to an exemplary embodiment of the disclosure and may correspond to a cross-section taken along a line I-I' of FIG. 1.

The display device according to one or more embodiments may be implemented as an electronic device such as a smart phone, a mobile phone, a smart watch, a navigation device, a gaming device, a television (TV), an automobile head unit, a laptop computer, a tablet computer, a Personal Media Player (PMP), or a Personal Digital Assistant (PDA). Also, the electronic device may be a flexible device.

The display device 1 includes a display area DA where an image is displayed, and a peripheral area PA around the display area DA. The display device 1 may provide a certain image by using light emitted from pixels arranged in the display area DA.

Shapes of the display device 1 may vary. For example, the shapes may include a rectangular plane having two pairs of parallel sides. When the shape of the display device 1 is a rectangle, any one pair among the two pairs of sides may be greater than the other pair. For convenience of discussion, it is assumed that a shape of the display device is a rectangle including a pair of long sides and a pair of short sides. However, embodiments of the display device are not limited to this shape. An extension direction of the short sides is a first direction (e.g., an x direction), an extension direction of the long sides is a second direction (e.g., an y direction), and a direction perpendicular to the above extension directions is a third direction (e.g., a z direction). In an exemplar embodiment, the display device 1 has a non-rectangular shape. The non-rectangular shape may be, for example, a circle, an oval, a polygon of which portions are circular, and a polygon except a square.

When the display area DA is planar, the display area DA may have a rectangular shape as shown in FIG. 1. In an exemplary embodiment, the shape of the display area DA is a polygon such as a triangle, a pentagon, a hexagon, a circle, an oval, or an atypical shape.

The peripheral area PA is an area around the display area DA and may be a type of a non-display area where pixels are not arranged. The display area DA may be entirely surrounded by the peripheral area PA. The peripheral area PA may include pads (e.g., conductive elements). Various wires for transmitting electrical signals to the display area DA, a printed circuit board, or a driver IC chip may be attached to the pads.

Hereinafter, an organic light-emitting display device is used as the display device 1 according to an embodiment, but embodiments of the disclosure are not limited this particular type of display device. In an exemplary embodiment, the display device 1 may be an inorganic light-emitting display (or an inorganic EL display) device or a quantum-dot light-emitting display device.

Referring to FIG. 2, the display device 1 includes a display panel 10, an input sensing layer 40 disposed on the display panel 10, and an optical functional layer 50 disposed on the input sensing layer 40. The display panel 10, the input sensing layer 40, and the optical functional layer 50 may be covered by a window 60. For example, the window 60 may be made of a transparent material such as glass or plastic.

The display panel 10 may display an image. The display panel 10 includes the pixels arranged in the display area DA. Each pixel may include a display element. The display element may be connected to a pixel circuit. The display element may include an organic light-emitting diode, or a quantum-dot organic light-emitting diode.

The input sensing layer 40 may obtain coordinate information according to an external input, for example, a touch event. For example, the input sensing layer 40 may determine a location within the display panel 10 touched by a user. The input sensing layer 40 may include a sensing electrode (or a touch electrode) and trace lines connected to the sensing electrode. The input sensing layer 40 may be disposed on the display panel 10. The input sensing layer 40 may detect an external input in a mutual-capacitance manner and/or a self-capacitance manner.

The input sensing layer 40 may be directly formed on the display panel 10 or may be separately formed. The input sensing layer 40 may be coupled to the display panel 10 by using an adhesive layer such as an optical clear adhesive. For example, the input sensing layer 40 may be consecutively formed after a process of forming the display panel 10. The input sensing layer 40 may be a portion of the display panel 10. In an exemplary embodiment, the adhesive layer is not disposed between the input sensing layer 40 and the display panel 10. FIG. 2 shows that the input sensing layer 40 is disposed between the display panel 10 and the optical functional layer 50. However, in an exemplary embodiment, the input sensing layer 40 is disposed on the optical functional layer 50. For example, the input sensing layer 40 may be disposed between the window 60 and the optical functional layer 50.

The optical functional layer 50 may include a reflection prevention layer. The reflection prevention layer may reduce the reflectivity of light (external light) that is incident to the display panel 10 from the outside through the window 60. In an exemplary embodiment, the reflection prevention layer includes a retarder (or a waveplate) and a polarizer. In an exemplary embodiment, the retarder transmits a beam of light and modifies its polarization state without attenuating, deviating, or displacing the beam. In an exemplary embodiment, the polarizer is an optical filter that allows light waves of a specific polarization to pass through while blocking light waves of other polarizations. The retarder may be of a film type or a liquid-crystal coating type and may include a $\lambda/2$ retarder and/or a $\lambda/4$ retarder. The polarizer may also be of a film type or a liquid-crystal coating type. The polarizer of a film type may include a stretchable synthetic resin film, and the polarizer of a liquid-crystal coating type may include liquid crystals arranged in a certain arrangement. The retarder and the polarizer may further include a protection film. The retarder and the polarizer themselves or the protection film may be a base layer of the reflection prevention layer.

In an exemplary embodiment, the reflection prevention layer includes a black matrix and color filters. The color filters may be arranged by considering colors of light respectively emitted from the pixels. In an exemplary embodiment, the reflection prevention layer includes a destructive interference structure. The destructive interference structure may include a first reflection layer and a second reflection layer arranged at different layers. First reflection light and second reflection light, which are respectively reflected from the first reflection layer and the second reflection layer, destructively interfere with each other, and the reflectivity of external light may decrease accordingly.

In an exemplary embodiment, the optical functional layer 50 includes a lens layer (e.g., a lens). The lens layer may improve the output efficiency of the light emitted from the display panel 10 or may decrease a color difference. The lens layer may include a layer having a convex or concave lens shape and/or may include layers of which refractive indices are different. The optical functional layer 50 may include both the reflection prevention layer and the lens layer or may include any one thereof.

In an embodiment, the optical functional layer 50 is continuously formed after a process of forming the display panel 10 and/or the input sensing layer 40. In an embodiment, the adhesive layer is not disposed between the optical functional layer 50 and the display panel 10 and/or the input sensing layer 40 when the optical functional layer 50 is continuously formed.

Figure 3:
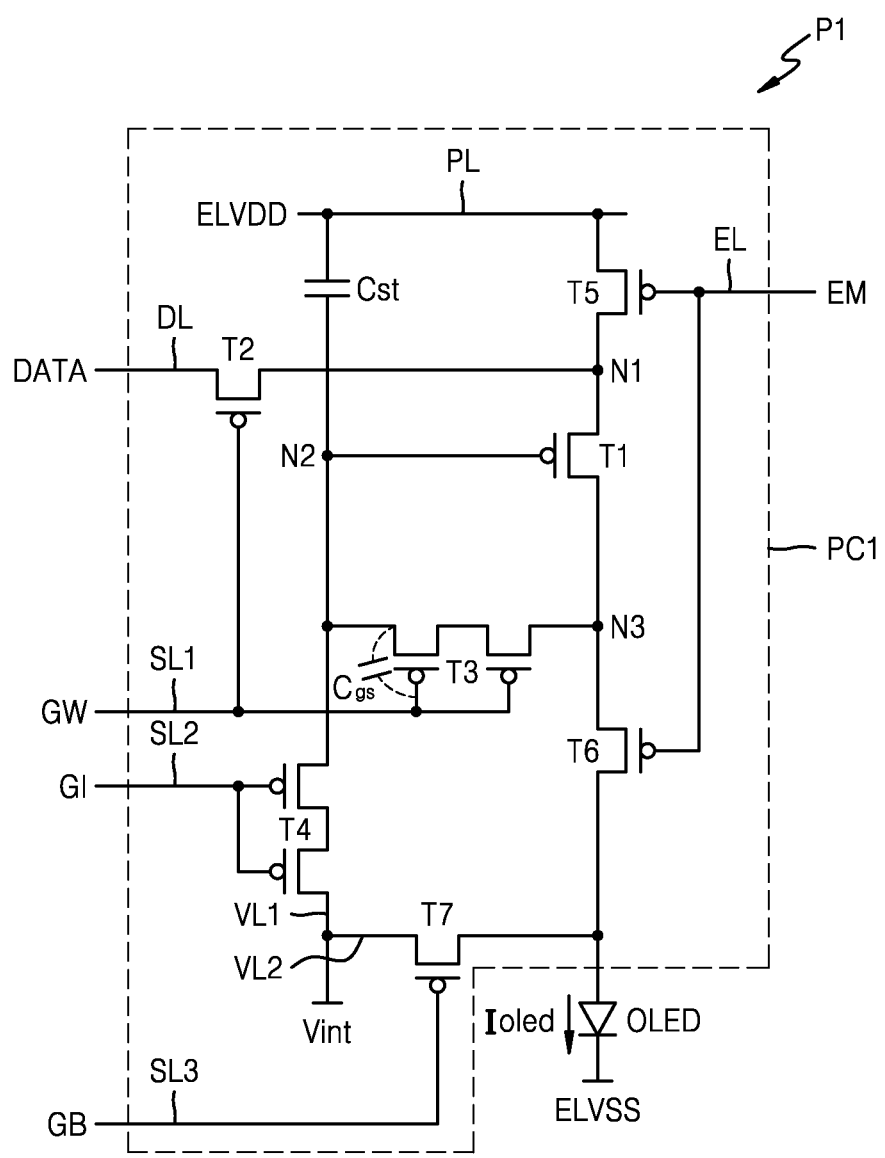
FIG. 3 is an equivalent circuit diagram illustrating a pixel according to an exemplary embodiment of the disclosure.
Figure 4:
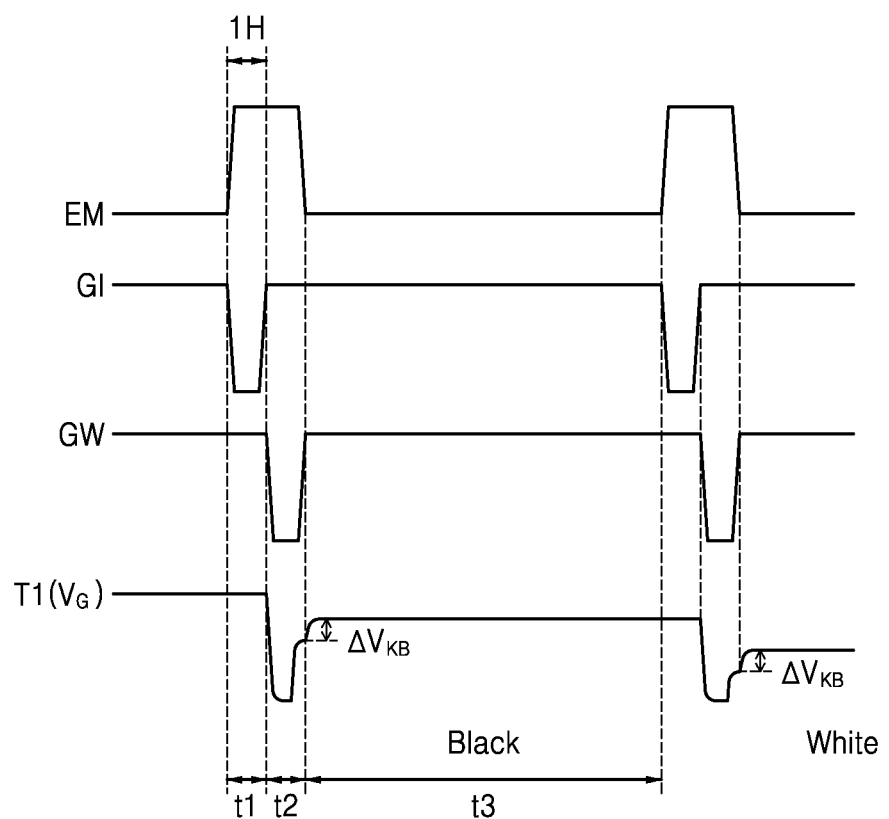
FIG. 4 is a timing diagram of a driving of the pixel of FIG. 3 according to an exemplary embodiment of the disclosure.

FIG. 3 is an equivalent circuit diagram illustrating a pixel of the display panel 10 according to an exemplary embodiment of the inventive concept. FIG. 4 is a timing diagram representing a driving of the pixel of FIG. 3.

Referring to FIG. 3, a pixel P1 includes an organic light-emitting diode OLED as a display element and a pixel circuit PC1 connected to the organic light-emitting diode OLED. The pixel circuit PC1 may include first to seventh transistors T1 to T7, and according to types (p-type or n-type) and/or operation conditions of transistors, a first terminal of each of the first to seventh transistors T1 to T7 may be a source terminal or a drain terminal, and a second terminal thereof may be different from the first terminal. For example, when the first terminal is a source terminal, the second terminal may be a drain terminal. In an embodiment, the first to seventh transistors T1 to T7 may be implemented by a p-channel multi-oxide semiconductor field effect transistor MOSFET or a p-channel metal oxide semiconductor (PMOS) transistor.

The pixel circuit PC1 is connected to a first scan line SL1 transmitting a first scan signal GW, a second scan line SL2 transmitting a second scan signal GI, a third scan line SL3 transmitting a third scan signal GB, an emission control line EL transmitting an emission control signal EM, and a data line DL transmitting a data signal DATA.

The pixel circuit PC1 is also connected to a driving voltage line PL and first and second initialization voltage lines VL1 and VL2. The driving voltage line PL transmits a driving voltage ELVDD to the first transistor T1. The first initialization voltage line VL1 may transmit an initialization voltage Vint to a gate terminal of the first transistor T1. The second initialization voltage line VL2 may transmit the initialization voltage Vint to the organic light-emitting diode OLED.

The first transistor T1 includes a gate terminal connected to a second node N2, a first terminal connected to a first node N1, and a second terminal connected to a third node N3. The first transistor T1 functions as a driving transistor and receives the data signal DATA according to a switching operation of the second transistor T2, thus providing a driving current to the organic light-emitting diode OLED.

The second transistor T2 (a switching transistor) includes a gate terminal connected to the first scan line SL1, a first terminal connected to the data line DL, and a second terminal connected to the first node N1 (or the first terminal of the first transistor). The second transistor T2 may be turned on in response to the first scan signal GW transmitted through the first scan line SL1 and may perform a switching operation of transmitting the data signal DATA, which is transmitted to the data line DL, to the first node N1.

The third transistor T3 (a compensation transistor) includes the gate terminal connected to a first scan line SL1, a first terminal connected to the second node N2 (or the gate terminal of the first transistor T1), and a second terminal connected to the third node N3 (or the second terminal of the first transistor T1). The third transistor T3 may be turned on in response to the first scan signal GW transmitted through the first scan line SL1 and may diode-connect the first transistor T1 to compensate a threshold voltage of the first transistor T1. The third transistor T3 may have a structure in which at least two transistors are connected in series. For example, element T3 shown in FIG. 3 may be implemented by a pair of transistors connected in series.

The fourth transistor T4 (a first initialization transistor) includes a gate terminal connected to a second scan line SL2, a first terminal connected to the first initialization voltage line VL1, and a second terminal connected to the second node N2. The fourth transistor T4 may be turned on in response to a second scan signal GI transmitted through the second scan line SL2 and transmit the first initialization voltage Vint to the gate terminal of the first transistor T1, thereby initializing a gate voltage of the first transistor T1. The fourth transistor T4 may have a structure in which at least two transistors are connected in series. For example, element T4 shown in FIG. 3 may be implemented by a pair of transistors connected in series.

The fifth transistor T5 (or a first emission control transistor) includes a gate terminal connected to the emission control line EL, a first terminal connected to the driving voltage line PL, and a second terminal connected to the first node N1. The sixth transistor T6 (a second emission control transistor) includes a gate electrode connected to the emission control line EL, a first terminal connected to the third node N3, and a second terminal connected to a pixel electrode of the organic light-emitting diode OLED. The fifth and sixth transistors T5 and T6 are simultaneously turned on in response to the emission control signal EM transmitted through the emission control line EL, and thus a current flows in the organic light-emitting diode OLED.

The seventh transistor T7 (a second initialization transistor) includes a gate terminal connected to a third scan line SL3, a first terminal connected to the second terminal of the sixth transistor T6 and the pixel electrode of the organic light-emitting diode OLED, and a second terminal connected to the second initialization voltage line VL2. The seventh transistor T7 may be turned on in response to a third scan signal GB transmitted through the third scan line SL3 and may initialize a voltage of the pixel electrode of the organic light-emitting diode OLED by transmitting the initialization voltage to the pixel electrode of the organic light-emitting diode OLED. The seventh transistor T7 may not be formed. In an exemplary embodiment, the seventh transistor T7 is omitted. When, the seventh transistor T7 is omitted, the second initialization voltage line VL2 can be directly connected to the organic light-emitting diode OLED.

A capacitor Cst includes a first electrode connected to the second node N2 and a second electrode connected to the driving voltage line PL.

The organic light-emitting diode OLED may include a pixel electrode and a common electrode facing the pixel electrode. The common electrode may receive a common voltage ELVSS. In an exemplary embodiment, the driving voltage ELVDD is higher than the common voltage ELVSS. The organic light-emitting diode OLED emits light of a certain color after receiving the driving current from the first transistor T1, and thus images may be displayed. The common electrode may be shared by pixel P1 and one more pixels like pixel P1.

Referring to FIG. 4, the pixel P1 is driven in a first period of time t1, a second period of time t2, and a third period of time t3, during one frame or frame period. The display panel 10 may include several rows of pixels. Each row may be driven sequentially during the frame period so that one frame of image data is output to the display panel during the frame period. The first scan signal GW and the second scan signal GI may be applied as on voltages during one horizontal period 1H. Here, the term 'on voltage' may denote a turn-on voltage of a transistor and may be a voltage having a low level. Although not shown in FIG. 4, the third scan signal GB may be applied as the on voltage having a low level at the same timing. In an exemplary embodiment, only one row of the pixels is driven during one horizontal period 1H.

The first period of time t1 is a period in which the second node N2 connected to the gate terminal of the first transistor T1 is initialized and an on bias (e.g., a bias voltage or current) is applied to the gate terminal of the first transistor T1. In the first period of time t1, the second scan signal GI having a low level is transmitted to the second scan signal SL2, and the fourth transistor T4 is turned on accordingly. A voltage of the second node N2, that is, a voltage of the gate terminal of the first transistor T1, is initialized by the initialization voltage Vint supplied from the first initialization voltage line VL1

The second period of time t2 is a threshold voltage compensation and data write period. In the second period of time t2, the first scan signal GW having a low level is transmitted to the first scan line SL1, and the second transistor T2 is turned on accordingly. The data signal DATA supplied from the data line DL is transmitted to the first node N1. When the second transistor T2 is turned on, the third transistor T3 is simultaneously turned on to diode-connect the first transistor T1, and a compensation voltage (e.g., a threshold voltage of the first transistor T1) compensated for in the data signal DATA, is applied to the second node N2, that is, the gate terminal of the first transistor T1. Accordingly, the driving voltage ELVDD and a compensation voltage are respectively applied to both ends of the capacitor Cst, and charges corresponding to a voltage difference between the ends of the capacitor Cst are stored in the capacitor Cst.

In an exemplary embodiment, the emission control signal EM, which is transmitted to the emission control line EL during the first and second periods of time t1 and t2, has a constant high level, and a level of the emission control signal EM transitions from the high level to the low level in the third period of time t3. The third period of time t3 is an emission period in which the organic light-emitting diode OLED emits light. In the third period of time t3, the fifth and sixth transistors T5 and T6 are turned on. The driving current, which corresponds to the charges stored in the capacitor Cst, is provided to the organic light-emitting diode OLED through the first transistor T1, and thus, the organic light-emitting diode OLED emits light.

When the second period of time t2 is changed to the third period of time t3, the third transistor T3 having been on is turned off, and thus, the voltage of the second node N2 (e.g., a voltage $V_G$ of the gate terminal of the first transistor T1) may change because of a parasitic capacitance Cgs generated between the gate terminal and the first terminal of the third transistor T3. A variation in a voltage of the gate terminal of the first transistor T1 is referred to as a kick back voltage $\Delta V_{KB}$. When a pixel displays black and then white, afterimages may be perceivable in an image because of the kick back voltage $\Delta V_{KB}$.

Because the kick back voltage $\Delta V_{KB}$ is in proportion to a size of the parasitic capacitance Cgs, there is a need to reduce the kick back voltage $\Delta V_{KB}$ by decreasing the parasitic capacitance Cgs of the third transistor T3 to reduce the afterimages.

Figure 5:
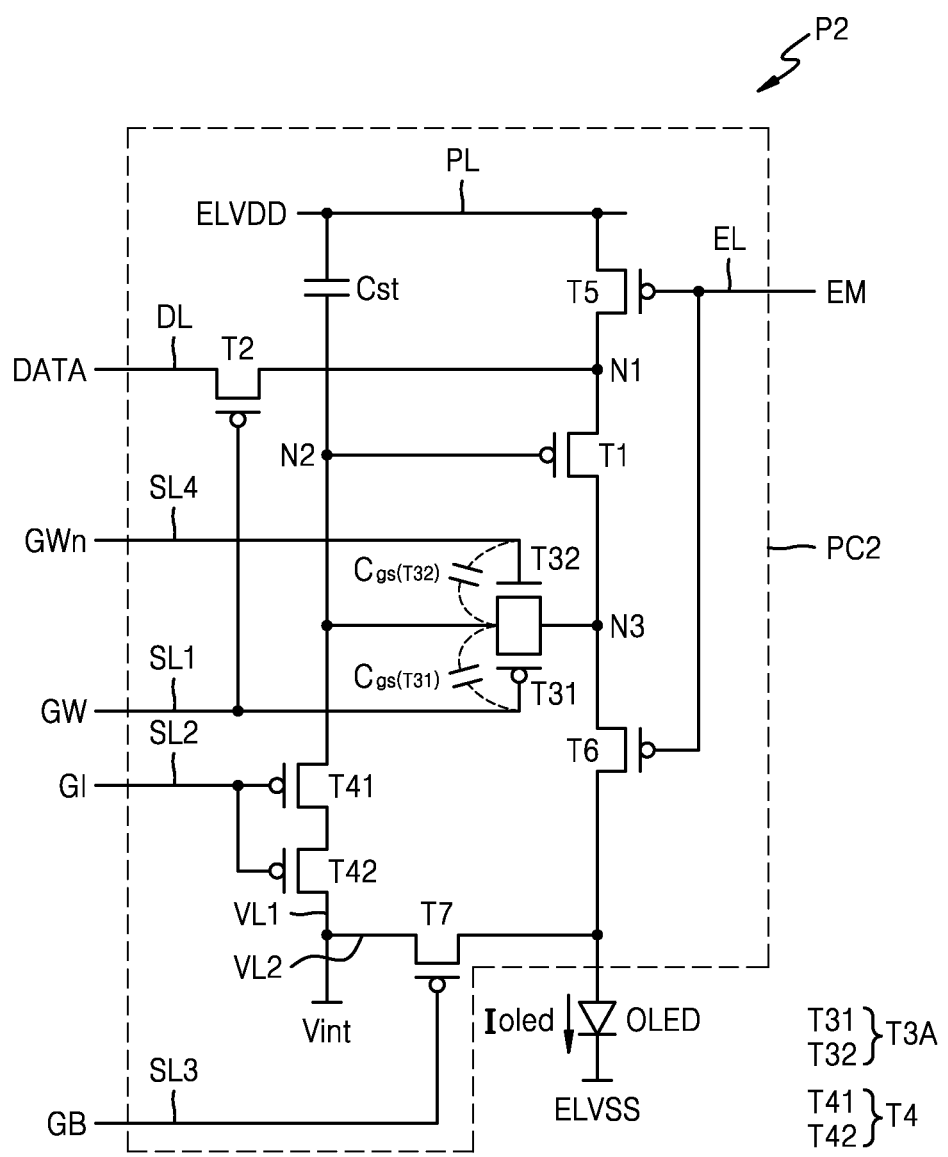
FIG. 5 is an equivalent circuit diagram illustrating a pixel according to an exemplary embodiment of the disclosure.
Figure 6:
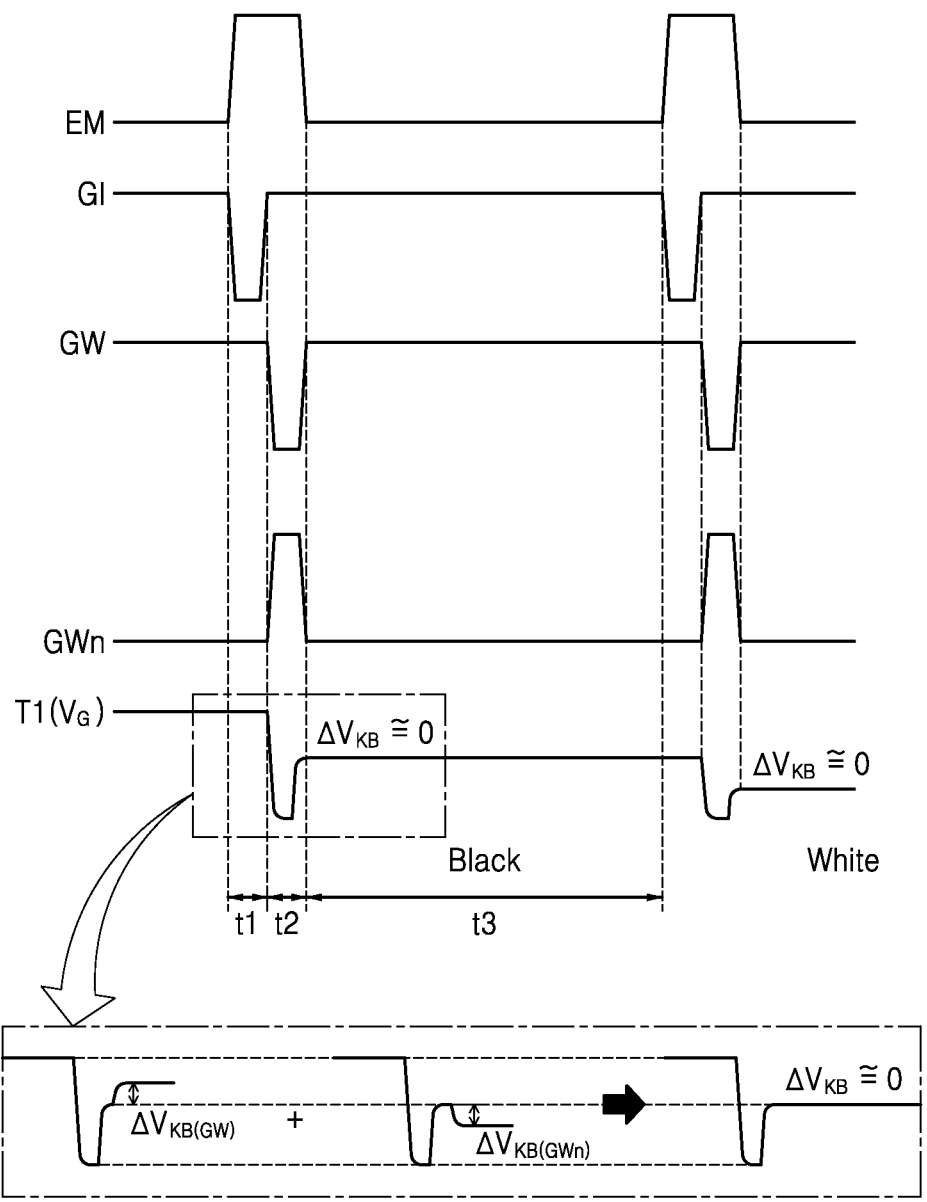
FIG. 6 is a timing diagram of a driving of the pixel of FIG. 5 according to an exemplary embodiment of the disclosure.

FIG. 5 is an equivalent circuit diagram illustrating a pixel according to an exemplary embodiment of the inventive concept. FIG. 6 is a timing diagram for a driving of the pixel of FIG. 5.

Referring to FIG. 5, a pixel P2 includes the organic light-emitting diode OLED as a display element and a pixel circuit PC2 connected to the organic light-emitting diode OLED. The pixel circuit PC2 includes the first to seventh transistors T1, T2, T3A, T4, T5, T6, T7, and according to types (p-type or n-type) and operation conditions of the transistors, the first terminal of each of the first to seventh transistors T1, T2, T3A, T4, T5, T6, T7 may be a source terminal or a drain terminal, and a second terminal thereof may be different from the first terminal. For example, when the first terminal is a source terminal, the second terminal may be a drain terminal.

In an embodiment, a 3-2 terminal T32 of the first to seventh transistors T1, T2, T3A, T4, T5, T6, T7 may be implemented by an n-channel MOSFET or an n-channel metal oxide semiconductor (NMOS) transistor, and the others thereof may each be implemented by a PMOS transistor.

The pixel circuit PC2 may be connected to the first scan line SL1 transmitting the first scan signal GW, the second scan line SL2 transmitting the second scan signal GI, the third scan line SL3 transmitting the third scan signal GB, and a fourth scan line SL4 transmitting a fourth scan signal GWn, the emission control line EL transmitting the emission control signal EM, and the data line DL transmitting the data signal DATA.

The pixel circuit PC2 may also be connected to the driving voltage line PL and the first and second initialization voltage lines VL1 and VL2. The driving voltage line PL may transmit the driving voltage ELVDD to the first transistor T1. The first initialization voltage line VL1 may transmit the initialization voltage Vint to the gate terminal of the first transistor T1. The second initialization voltage line VL2 may transmit the initialization voltage Vint to the organic light-emitting diode OLED.

The first transistor T1 includes the gate terminal connected to the second node N2, the first terminal connected to the first node N1, and the second terminal connected to the third node N3. The first transistor T1 functions as the driving transistor, and according to the switching operation of the second transistor T2, the first transistor T1 provides the driving current to the organic light-emitting diode OLED by receiving the data signal DATA.

The second transistor T2 (the switching transistor) includes the gate terminal connected to the first scan line SL1, the first terminal connected to the data line DL, and the second terminal connected to the first node N1 (or the first terminal of the first transistor). The second transistor T2 may be turned on in response to the first scan signal GW transmitted through the first scan line SL1 and may perform the switching operation of transmitting the data signal DATA, which is transmitted to the data line DL, to the first node N1.

A third transistor T3A (a compensation transistor) may include two sub-transistors connected in parallel. For example, as shown in FIG. 5, the third transistor T3A includes a 3-1 transistor T31 as a first sub-transistor and a 3-2 transistor T32 as a second sub-transistor. The 3-1 transistor T31 may be an NMOS transistor, and the 3-2 transistor T32 may be a PMOS transistor.

The 3-1 transistor T31 includes the gate terminal connected to the first scan line SL1, the first terminal connected to the second node N2 (or the gate terminal of the first transistor T1), and the second terminal connected to the third node N3 (or the second terminal of the first transistor T1). The 3-2 transistor T32 includes a gate terminal connected to a gate terminal connected to the fourth scan line SL4, the first terminal connected to the second node N2, and the second terminal connected to the third node N3. The 3-1 transistor T31 may be turned on in response to the first scan signal GW transmitted through the first scan line SL1, and the 3-2 transistor T32 may be turned on in response to the fourth scan signal GWn transmitted through the fourth scan line SL4. In an exemplary embodiment, the fourth scan signal GWn is an inverted signal of the first scan signal GW. The 3-1 transistor T31 and the 3-2 transistor T32 may be simultaneously turned on and may diode-connect the first transistor T1.

The fourth transistor T4 may include two sub-transistors that are connected in series. For example, as shown in FIG. 5, the fourth transistor T4 includes a 4-1 transistor T41 as a first sub-transistor and a 4-2 transistor T42 as a second sub-transistor. The 4-1 transistor T41 and the 4-2 transistor T42 may each be a PMOS transistor.

The 4-1 transistor T41 includes the gate terminal connected to the second scan line SL2, a first terminal connected to the second terminal of the 4-2 transistor T42, and a second terminal connected to the second node N2. The 4-2 transistor T42 includes the gate terminal connected to the second scan line SL2, a first terminal connected to the first initialization voltage line VL1, and a second terminal connected to the first terminal of the 4-1 transistor T41. The 4-1 transistor T41 and the 4-2 transistor T42 may be simultaneously turned on in response to the second scan signal GI transmitted through the second scan line SL2 and transmit the initialization voltage Vint to the gate terminal of the first transistor T1, thereby initializing the gate voltage of the first transistor T1.

The fifth transistor T5 (or a first emission control transistor) includes the gate terminal connected to the emission control line EL, the first terminal connected to the driving voltage line PL, and the second terminal connected to the first node N1. The sixth transistor T6 (a second emission control transistor) includes a gate electrode connected to the emission control line EL, the first terminal connected to the third node N3, and the second terminal connected to the pixel electrode of the organic light-emitting diode OLED. The fifth and sixth transistors T5 and T6 are simultaneously turned on in response to the emission control signal EM transmitted through the emission control line EL, and thus, a current flows in the organic light-emitting diode OLED.

The seventh transistor T7 (a second initialization transistor) includes the gate terminal connected to the third scan line SL3, the first terminal connected to the second terminal of the sixth transistor T6 and the pixel electrode of the organic light-emitting diode OLED, and the second terminal connected to the second initialization voltage line VL2. The seventh transistor T7 may be turned on in response to the third scan signal GB transmitted through the third scan line SL3 and may initialize a voltage of the pixel electrode of the organic light-emitting diode OLED by transmitting the initialization voltage to the pixel electrode of the organic light-emitting diode OLED. In an exemplary embodiment of the disclosure, the seventh transistor T7 is omitted. For example, when the seventh transistor T7 is omitted, the second initialization voltage line VL2 may be directly connected to the organic light-emitting diode OLED.

The capacitor Cst includes the first electrode connected to the second node N2 and the second electrode connected to the driving voltage line PL.

The organic light-emitting diode OLED may include the pixel electrode and the common electrode facing the pixel electrode, and the common electrode may receive the common voltage ELVSS. The organic light-emitting diode OLED emits light of a certain color after receiving the driving current from the first transistor T1, and thus images may be displayed. The common electrode may be shared by a pixel P2 and pixels like the pixel P2. The common voltage ELVSS may be lower than the driving voltage ELVDD. The initialization voltage Vint may be a voltage identical to the common voltage ELVSS or a voltage lower than the common voltage ELVSS.

Referring to FIG. 6, the pixel P2 is driven in the first period of time t1, the second period of time t2, and the third period of time t3 during one frame or frame period. The first scan signal GW, the second scan signal GI, and the fourth scan signal GWn may be applied as on voltages during one horizontal period 1H. The on voltages of the first scan signal GW and the second scan signal GI may be voltages having low levels, and the on voltage of the fourth scan signal GWn may be a voltage having a high level.

The first period of time t1 is an initialization period in which the second node N2 connected to the gate terminal of the first transistor T1 is initialized and an on bias (e.g., a bias current or voltage) is applied to the gate terminal of the first transistor T1. In the first period of time t1, the second scan signal GI having a low level is transmitted to the second scan signal SL2, and the fourth transistor T4 is turned on accordingly. The voltage of the second node N2 (e.g., the voltage of the gate terminal of the first transistor T1) is initialized by the initialization voltage Vint supplied from the first initialization voltage line VL1.

The second period of time t2 is the threshold voltage compensation and data write period. In the second period of time t2, the first scan signal GW having a low level is transmitted to the first scan line SL1, and the fourth scan signal GWn having a high level is transmitted to the fourth scan signal SL4 at the same time. Accordingly, the second transistor T2, the 3-1 transistor T31, and the 3-2 transistor T32 may be simultaneously turned on.

The data signal DATA provided from the data line DL is transmitted to the first node N1 by the second transistor T2. The 3-1 transistor T31 and the 3-2 transistor T32, which have been on, diode-connect the first transistor T1, and the compensation voltage (e.g., the compensation voltage of the first transistor T1 compensated for in the data signal DATA) is applied to the second node N2, that is the gate terminal of the first transistor T1. Accordingly, the driving voltage ELVDD and a compensation voltage are respectively applied to both ends of the capacitor Cst, and charges corresponding to a voltage difference between the ends of the capacitor Cst are stored in the capacitor Cst.

In an exemplary embodiment, the emission control signal EM, which is transmitted to the emission control line EL, has a constant high level in the first and second periods of time t1 and t2, and a level of the emission control signal EM transitions from the high level to the low level in the third period of time t3. The third period of time t3 is an emission period in which the organic light-emitting diode OLED emits light. In the third period of time t3, the fifth and sixth transistors T5 and T6 are turned on. The driving current, which corresponds to the charges stored in the capacitor Cst, is provided to the organic light-emitting diode OLED through the first transistor T1, and thus, the organic light-emitting diode OLED emits light.

In an exemplary embodiment, the third transistor T3A of the pixel P2 has a structure in which the 3-1 transistor T31 that is the PMOS and the 3-2 transistor T32 that is the NMOS are connected in parallel. When the second period of time t2 is changed to the third period of time t3, the 3-1 transistor T31 and the 3-2 transistor T32, which have been on, are turned off, respectively. When the 3-1 transistor T31 and the 3-2 transistor T32 are turned off, a kick back voltage $\Delta V_{KB(GW)}$ at the gate terminal of the first transistor T1, which is generated because of a parasitic capacitance $Cgs_{(T31)}$ of the 3-1 transistor T31 is offset (canceled) by a kick back voltage $\Delta V_{KB(GWn)}$ at the gate terminal of the first transistor T1 that is generated because of a parasitic capacitance $Cgs_{(T32)}$ of the 3-2 transistor T32. Therefore, when a pixel displays black and then white or vice versa, because the kick back voltage $\Delta V_{KB}$ at the second node N2 (e.g., the gate terminal of the first transistor T1) decreases (or becomes zero), perceived afterimages in an image may decrease.

Figure 7A:
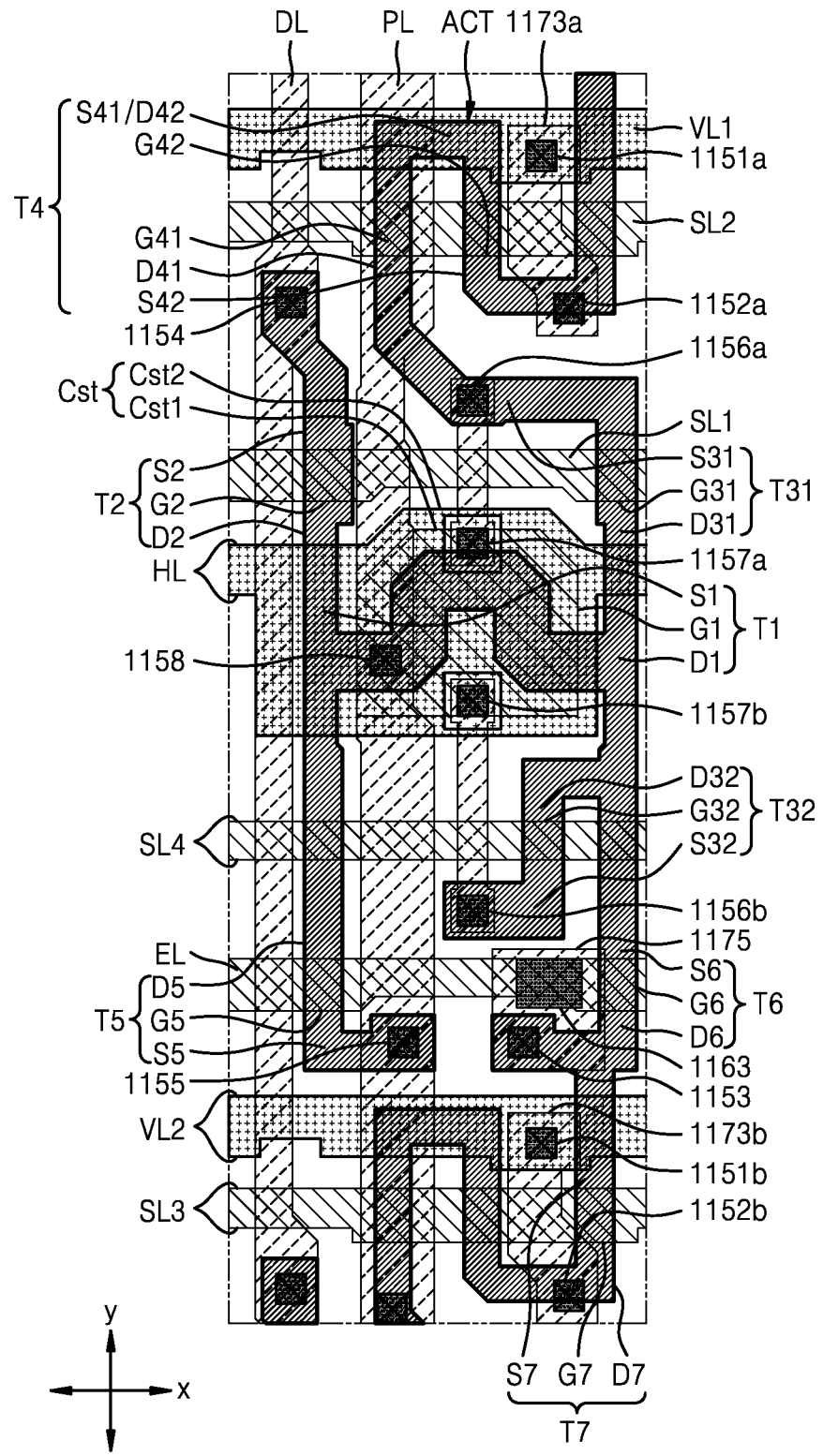
FIG. 7A is a plan view illustrating a pixel circuit of FIG. 5 according to an exemplary embodiment of the disclosure.
Figure 7B:
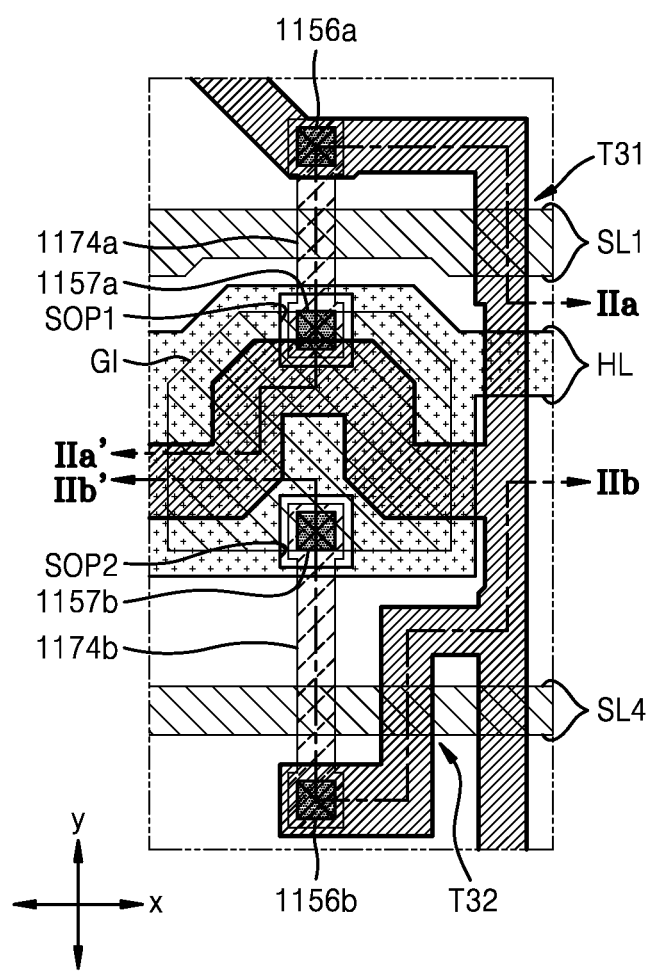
FIG. 7B is an enlarged plan view illustrating a portion of FIG. 7 according to an exemplary embodiment of the disclosure.
Figure 8A:
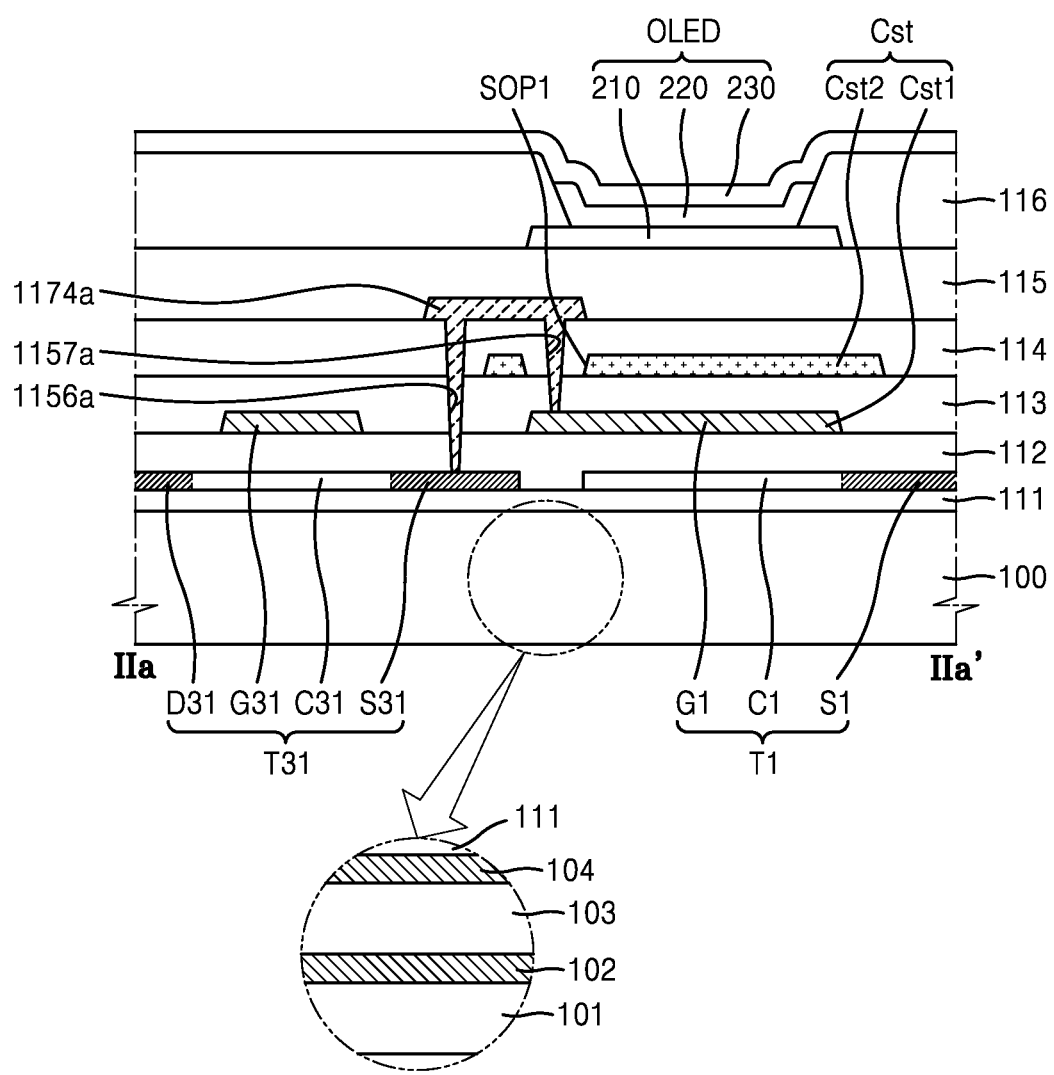
FIGS. 8A and 8B are cross-sectional views illustrating a display device taken along lines IIa-IIa' and IIb-IIb' of FIG. 7B according to an exemplary embodiment of the disclosure.
Figure 8B:
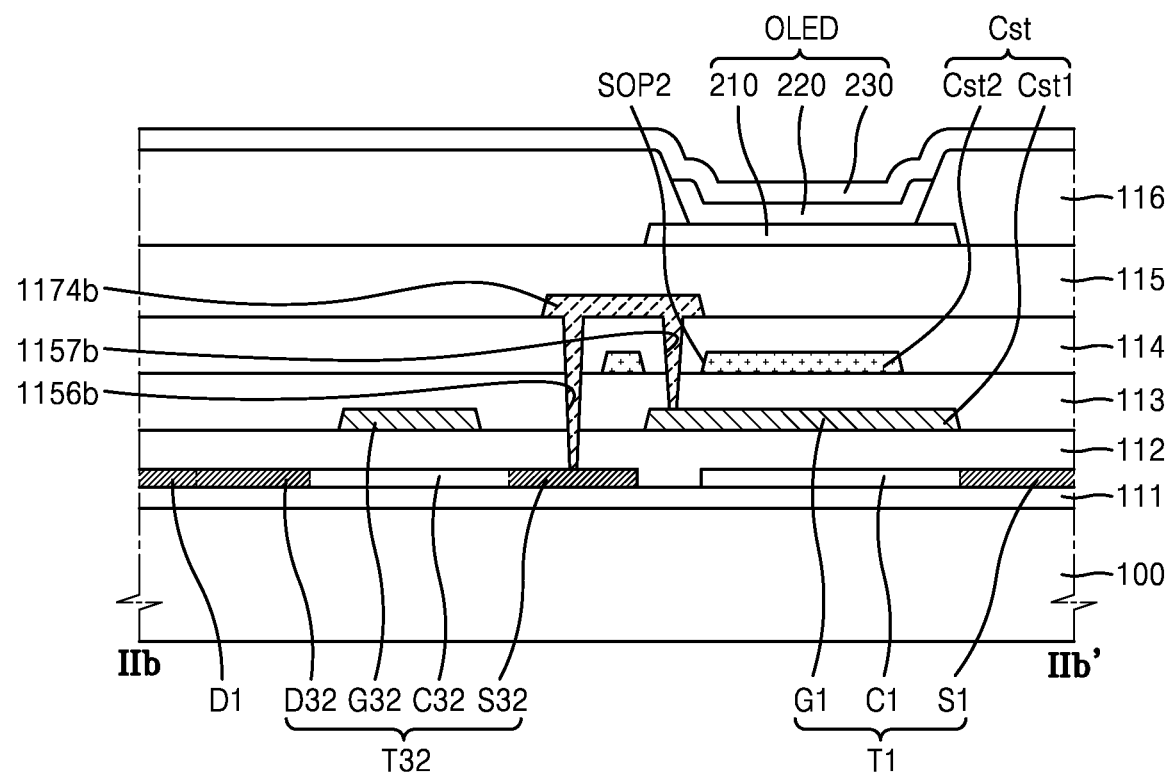

FIG. 7 is a plan view illustrate a pixel circuit of FIG. 5 according to an exemplary embodiment of the disclosure. FIG. 7BFIG. 7B is an enlarged plan view of a portion of FIG. 7. FIGS. 8A and 8B are cross-sectional views taken along lines IIa-IIa' and IIb-IIb' of FIG. 7B. FIG. 7A corresponds to a plan view of the pixel P2 of FIG. 5. Hereinafter, the descriptions will be provided with reference to FIGS. 7 to 8B.

The first to seventh transistors T1, T2, T3A, T4, T5, T6, T7 of FIG. 5 may each be implemented by a thin-film transistor (TFT). Hereinafter, the first to seventh transistors T1, T2, T3A, T4, T5, T6, T7 will be referred to as first to seventh thin-film transistors T1, T2, T3A, T4, T5, T6, T7. The third thin-film transistor T3A may include two sub-transistors that are connected in parallel. For example, the third thin-film transistor T3A may include the 3-1 thin-film transistor T31 as a first sub-thin-film transistor and the 3-2 thin-film transistor T32 as a second sub-thin-film transistor. The fourth thin-film transistor T4 may include two sub-transistors that are connected in series. For example, the fourth thin-film transistor T4 may include the 4-1 thin-film transistor T41 as the first sub-thin-film transistor and the 4-2 thin-film transistor T42 as the second sub-thin-film transistor.

The gate terminal, the first terminal, and the second terminal of a transistor of the pixel circuit of FIG. 5 may correspond to a gate electrode, a source area, and a drain area of each thin-film transistor of FIG. 7A, respectively. The source area and the drain area may be a source electrode and a drain electrode of the thin-film transistor according to other embodiments.

A semiconductor layer ACT may be formed on a substrate 100. In an exemplary embodiment, a buffer layer 111 may be disposed on the substrate 100, and the semiconductor layer ACT may be disposed on the buffer layer 111. Some regions of the semiconductor layer ACT may respectively form semiconductor layers of the first to seventh thin-film transistors T1 to T7.

The substrate 100 may include a glass material, a ceramic material, a metallic material, or a flexible or bendable material. When the substrate 100 is flexible or bendable, the substrate 100 may include a polymer resin such as polyether sulphone (PES), polyacrylate, polyether imide (PEI), polyethylene naphthalate (PEN), polyethylene terephthalate (PET), polyphenylene sulfide (PPS), polyarylate, polyimide (PI), polycarbonate (PC), and cellulose acetate propionate (CAP).

The substrate 100 may have a multilayered structure. For example, as shown in FIGS. 8A and 8B, the substrate 100 may have a structure in which a first base layer 101, a first barrier layer 102, a second base layer 103, and a second barrier layer 104 are sequentially stacked. The first base layer 101 and the second base layer 103 may include the aforementioned polymer resin. The first barrier layer 102 and the second barrier layer 104 may be layers for preventing the penetration of foreign impurities and may be a layer or layers including an inorganic material such as silicon nitride $SiN_x$ or silicon oxide $SiO_x$.

The buffer layer 111 may increase the evenness (or uniformity) of an upper surface of the substrate 100 and may include an oxide layer such as $SiO_x$, a nitride layer such as $SiN_x$, or SiON.

The semiconductor layer ACT may include a silicon semiconductor. For example, the semiconductor layer ACT may include a Low Temperature Polysilicon or a Low Temperature polycrystalline silicon (LTPS).

The semiconductor layers of the first to seventh thin-film transistors T1, T2, T3A, T4, T5, T6, T7 may each include source areas S1 to S7, drain areas D1 to D7, and channel areas between the source areas S1 to S7 and the drain areas D1 to D7. FIGS. 8A and 8B show examples of a channel area C1 of the first thin-film transistor T1, a channel area C31 of the 3-1 thin-film transistor T31, and a channel area C32 of the 3-2thin-film transistor T32.

The channel area may be an area overlapped with the gate electrode. The source area and the drain area may be areas doped with impurities around the channel area. According to an embodiment, locations of the source area and the drain area may change. In an embodiment, the source and drain areas of the 3-2 thin-film transistor T32 of the first to seventh thin-film transistors T1, T2, T3A, T4, T5, T6, T7 may be doped with nitrogen (N) that is a group 5 element, and the source and drain areas of other thin-film transistors may be doped with boron (B) that is a group 3 element. For example, materials used to dope the drain area D1 of the first thin-film transistor T1 and a source area S6 of the sixth thin-film transistor T6, which are connected to a drain area D32 of the 3-2 thin-film transistor T32, may be different from materials used to dope the drain area D32 of the 3-2 thin-film transistor T32. Accordingly, the 3-2 thin-film transistor T32 may be implemented by an NMOS transistor, and the other thin-film transistors may each be implemented by a PMOS transistor.

A first gate insulating layer 112 may be disposed on the semiconductor layer ACT, and the gate electrode G1, the first scan line SL1, the second scan line SL2, the third scan line SL3, the fourth scan line SL4, and the emission control line EL of the first thin-film transistor T1 may be disposed on the first gate insulating layer 112. The first scan line SL1, the second scan line SL2, the third scan line SL3, the fourth scan line SL4, and the emission control line EL may extend in a first direction and may be separate from each other.

The first gate insulating layer 112 may include $SiO_2$, $SiN_x$, SiON, aluminum oxide ($Al_2O_3$), titanium oxide ($TiO_2$), tantalum oxide ($Ta_2O_5$), hafnium oxide ($HfO_2$), or zinc oxide ($ZnO_2$).

The gate electrode G1 of the first thin-film transistor T1 may overlap the semiconductor layer ACT and have an isolated pattern.

A region of the first scan line SL1, which overlaps the channel area of the second thin-film transistor T2, may be the gate electrode G2 of the second thin-film transistor T2, and a region of the first scan line SL1, which overlaps the channel area of the 3-1 thin-film transistor T31, may be the gate electrode G31 of the 3-1 thin-film transistor T31. A region of the fourth scan line SL4, which overlaps the channel area of the 3-2 thin-film transistor T32, may be the gate electrode G32 of the 3-2 thin-film transistor T32. Regions of the second scan line SL2, which overlap the channel area of the fourth thin-film transistor T4, may be gate electrodes G41 and G42 of the fourth thin-film transistor T4. A region of the third scan line SL3, which overlaps the channel area of the seventh thin-film transistor T7, may be a gate electrode G7 of the seventh thin-film transistor T7. Regions of the emission control line EL, which overlap the channel areas of the fifth and sixth thin-film transistors T5 and T6, may be gate electrodes G5 and G6 of the fifth and sixth thin-film transistors T5 and T6.

The gate electrode G1, the first scan line SL1, the second scan line SL2, the third scan line SL3, the fourth scan line SL4, and the emission control line EL of the first thin-film transistor T1 may each include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), and may each be a layer or layers including at least one material.

The second gate insulating layer 113 may be disposed on the gate electrode G1, the first scan line SL1, the second scan line SL2, the third scan line SL3, the fourth scan line SL4, and the emission control line EL of the first thin-film transistor T1. The second gate insulating layer 113 may include $SiO_2$, $SiN_x$, SiON, $Al_2O_3$, $TiO_2$, $Ta_2O_5$, $HfO_2$, or $ZnO_2$.

The first initialization voltage line VL1, the second initialization voltage line VL2, and an electrode voltage line HL may be disposed on the second gate insulating layer 113. The electrode voltage line HL and the first and second initialization voltage lines VL1 and VL2 may extend in the first direction and may be disposed apart from each other.

In an exemplary embodiment, the electrode voltage line HL covers at least part of the gate electrode G1 of the first thin-film transistor T1. The electrode voltage line HL may function as an upper electrode Cst2 of the capacitor Cst. In an exemplary embodiment, the electrode voltage line HL entirely covers the gate electrode G1.

A lower electrode Cst1 of the capacitor Cst may be integrally formed with the gate electrode G1 of the first thin-film transistor T1. For example, the gate electrode G1 of the first thin-film transistor T1 may function as the lower electrode Cst1 of the capacitor Cst. A first opening SOP1 and a second opening SOP2 may be formed in the upper electrode Cst2 of the capacitor Cst.

The electrode voltage line HL, the first initialization voltage line VL1, and the second initialization voltage line VL2 may each include at least one selected from the group consisting of Al, Pt, Pd, Ag, Mg, Au, Ni, Nd, Ir, Cr, Li, Ca, Mo, Ti, W, and Cu and may be a layer or layers.

An interlayer insulating layer 114 is disposed on the electrode voltage line HL, the first initialization voltage line VL1, and the second initialization voltage line VL2. The interlayer insulating layer 114 may include $SiO_2$, $SiN_x$, SiON, $Al_2O_3$, $TiO_2$, $Ta_2O_5$, $HfO_2$, or $ZnO_2$.

The data line DL, the driving voltage line PL, first and second node electrodes 1174a and 1174b, and connection electrodes 1173a, 1173b, and 1175 may be disposed on the interlayer insulating layer 114. The data line DL and the driving voltage line PL may extend in a second direction and may be disposed apart from each other.

The data line DL, the driving voltage line PL, the first and second node electrodes 1174a and 1174b, and the connection electrodes 1173a, 1173b, and 1175 may include conductive materials such as Mo, Al, Cu, and Ti and may each be a layer or layers. In an embodiment, the data line DL, the driving voltage line PL, the first and second node electrodes 1174a and 1174b, and the connection electrodes 1173a, 1173b, and 1175 each have a multilayered structure of Ti/Al/Ti.

The data line DL may be electrically connected to the source area S2 of the second thin-film transistor T2 through a contact hole 1154 formed in the first gate insulating layer 112, the second gate insulating layer 113, the interlayer insulating layer 114. In an exemplary embodiment, part of the data line DL is a source electrode contacting the source area S2.

The driving voltage line PL may be electrically connected to the upper electrode Cst2 of the capacitor Cst through a contact hole 1158 formed in the interlayer insulating layer 114. Therefore, the electrode voltage line HL may have a voltage level (a constant voltage) identical to the driving voltage line PL. Also, the driving voltage line PL may be electrically connected to the source area S5 of the fifth thin-film transistor T5 through a contact hole 1155 formed in the first gate insulating layer 112, the second gate insulating layer 113, and the interlayer insulating layer 114.

As shown in FIGS. 7A and 8A, the first node electrode 1174a may electrically connect the gate electrode G1 of the first thin-film transistor T1 to the source area S31 of the 3-1 thin-film transistor T31 and the drain area D41 of the 4-1 thin-film transistor T41 through the first opening SOP1 formed in the upper electrode Cst2 of the capacitor Cst. An end of the first node electrode 1174a may be electrically connected to the gate electrode G1 of the first thin-film transistor T1 through the contact hole 1157a formed in the second gate insulating layer 113 and the interlayer insulating layer 114. The other end of the first node electrode 1174a may be electrically connected to the source area S31 of the 3-1 thin-film transistor T31 through a contact hole 1156a formed in the first gate insulating layer 112, the second gate insulating layer 113, and the interlayer insulating layer 114.

As shown in FIGS. 7A and 8B, the second node electrode 1174b may electrically connect the gate electrode G1 of the first thin-film transistor T1 to the source area S32 of the 3-2 thin-film transistor T32 through the second opening SOP2 formed in the upper electrode Cst2 of the capacitor Cst. An end of the second node electrode 1174b may be electrically connected to the gate electrode G1 of the first thin-film transistor T1 through a contact hole 1157b formed in the second gate insulating layer 113 and the interlayer insulating layer 114. The other end of the second node electrode 1174b may be electrically connected to the source area S32 of the 3-2 thin-film transistor T32 through a contact hole 1156b formed in the first gate insulating layer 112, the second gate insulating layer 113, and the interlayer insulating layer 114.

The connection electrode 1173a may electrically connect the first initialization voltage line VL1 and the source area S42 of the 4-2 thin-film transistor T42 through a contact hole 1151a formed in the interlayer insulating layer 114 and a contact hole 1152a formed in the first gate insulating layer 112, the second gate insulating layer 113, and the interlayer insulating layer 114. The connection electrode 1173b may electrically connect the second initialization voltage line VL2 and the drain area D7 of the seventh thin-film transistor T7 through a contact hole 1151b formed in the interlayer insulating layer 114 and a contact hole 1152b formed in the first gate insulating layer 112, the second gate insulating layer 113, and the interlayer insulating layer 114.

The connection electrode 1175 may be electrically connected to the drain electrode D6 of the sixth thin-film transistor T6 through the contact hole 1153 formed in the first gate insulating layer 112, the second gate insulating layer 113, and the interlayer insulating layer 114. The sixth thin-film transistor T6 may be electrically connected to the pixel electrode 210 of the organic light-emitting diode OLED through the connection electrode 1175.

The planarization layer 115 may be disposed on the data line DL, the driving voltage line PL, the first and second node electrodes 1174a and 1174b, and the connection electrodes 1173a, 1173b, and 1175, and the organic light-emitting diode OLED may be disposed on the planarization layer 115.

FIG. 7A shows a structure of one pixel circuit PC2. In an embodiment, the pixels P2 having the same pixel circuit PC2 are arranged in the first and second directions. In this embodiment, the first initialization voltage line VL1, the second scan line SL2, the second initialization voltage line VL2, and the third scan line SL3 are shared by two pixel circuits PC2 that are adjacent to each other in the second direction.

That is, the first initialization voltage line VL1 and the second scan line SL2 may be electrically connected to a seventh thin-film transistor of a different pixel circuit PC2 that is adjacent to an upper side of the pixel circuit PC2 of FIG. 7A in the second direction shown in the drawing. Therefore, the second scan signal GI transmitted to the second scan line SL2 may be transmitted to a seventh thin-film transistor of the different pixel circuit PC2 as a third scan signal SL3. As described, the second initialization voltage line VL2 and the third scan line SL3 may be electrically connected to a fourth thin-film transistor of a different pixel circuit PC2 that is adjacent to a lower side of the pixel circuit PC2 of FIG. 7A in the second direction shown in the drawing. Therefore, the third scan signal GB transmitted to the third scan line SL3 may be transmitted to the fourth thin-film transistor of the different pixel circuit PC2 as a second scan signal.

The planarization layer 115 may have a planar upper surface to ensure that the pixel electrode 210 is flat. The planarization layer 115 may be a single layer or several layers including an organic material. The planarization layer 115 may include a general-purpose polymer such as benzocyclobutene (BCB), PI, hexamethyldisiloxane (HMDSO), polymethylmethacrylate (PMMA) or polystyrene (PS), a polymer derivative having a phenol-based group, an acryl-based polymer, an imide-based polymer, an aryl-ether-based polymer, an amide-based polymer, a fluorine-based polymer, a p-xylene-based polymer, a vinyl alcohol-based polymer, or a blend thereof.

In an exemplary embodiment, the planarization layer 115 includes an inorganic material. The planarization layer 115 may include $SiO_2$, $SiN_x$, SiON, $Al_2O_3$, $TiO_2$, $Ta_2O_5$, $HfO_2$, or $ZnO_2$. When the planarization layer 115 includes an inorganic material, chemical planarization polishing may be performed. In an exemplary embodiment, the planarization layer 115 includes both an organic material and an inorganic material.

As shown in FIGS. 8A and 8B, the organic light-emitting diode OLED includes the pixel electrode 210, the common electrode 230, and an intermediate layer 220 including an emission layer disposed between the pixel electrode 210 and the common electrode 230.

The pixel electrode 210 may be electrically connected to the connection electrode 1175 through the contact hole 1163 formed in the planarization layer 115, and the connection electrode 1175 may be electrically connected to the sixth thin-film transistor T6 through the contact hole 1153 formed in the first gate insulating layer 112, the second gate insulating layer 113, and the interlayer insulating layer 114.

The pixel electrode 210 may be a transparent (translucent) electrode or a reflective electrode. In some embodiments, the pixel electrode 210 may include a reflective layer including Ag, Mg, Al, Pt, Pd, Au, Ni, Nd, Ir, Cr, or a compound thereof, and a transparent or translucent electrode layer formed on the reflective layer. The transparent or translucent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). In some embodiments, the pixel electrode 210 may have a stack structure of ITO/Ag/ITO.

A pixel-defining layer 116 may be disposed on the planarization layer 115 and may define an emission area of a pixel by exposing a portion of the pixel electrode 210. The pixel-defining layer 116 may cover edges of the pixel electrode 210. In an exemplary embodiment, an upper surface of the pixel electrode 210 between the opposing edges is not covered by the pixel-defining layer 116. The pixel-defining layer 116 may include an organic insulating material such as polyimide PI, polyamide, acryl resin, Benzocyclobutene BCB resin, hexamethyldisiloxane HMDSO, or phenol resin.

The intermediate layer 220 may include an emission layer. The emission layer may include an organic material including a fluorescent or phosphorescent material emitting red light, green light, blue light or white light. The emission layer may include a low-molecular weight or a high-molecular weight organic material. As shown in FIGS. 8A and 8B, for convenience, the emission layer of the intermediate layer 220 is only shown. The organic light-emitting diode OLED may further include a first functional layer and/or a second functional layer on and under the emission layer. The first functional layer and/or a second functional layer may include a hole transport layer (HTL), a hole injection layer (HIL), or an electron transport layer (ETL), an electron injection layer (EIL). The intermediate layer 220 may be disposed respectively corresponding to the pixel electrodes 210. However, embodiments of the disclosure are not limited thereto, and at least some layers included in layers of the intermediate layer 220 may be integrally formed over the pixel electrodes 210.

The common electrode 230 may be a transparent electrode or a reflective electrode. In some embodiments, the common electrode 230 may be a transparent or translucent electrode and may include a metal thin-film including Li, Ca, LiF/Ca, LiF/Al, Al, Ag, Mg, and a compound thereof and having a low work function. Also, a transparent conductive oxide (TCO) layer including ITO, IZO, ZnO, or $In_2O_3$ may be further formed on the metal thin-film. The common electrode 230 may be integrally formed to correspond to the pixel electrodes 210.

Although not shown, a thin-film encapsulation layer (not shown) or a sealing substrate (not shown) may be disposed on the common electrode 230. The thin-film encapsulation layer may cover the display area DA and extend to an outer side of the display area DA. Such a thin-film encapsulation layer may include at least one inorganic encapsulation layer including an inorganic material and at least one organic encapsulation layer including an organic material. In some embodiments, the thin-film encapsulation layer may have a structure in which a first inorganic encapsulation layer/an organic encapsulation layer/a second inorganic encapsulation layer are stacked. The sealing substrate (not shown) may face the substrate 100, and in the peripheral area PA, the sealing substrate may be coupled to the substrate 100 by a sealing member such as a sealant or frit. Also, a spacer for preventing an indentation in a mask may be disposed on the pixel-defining layer 116.

Figure 9:
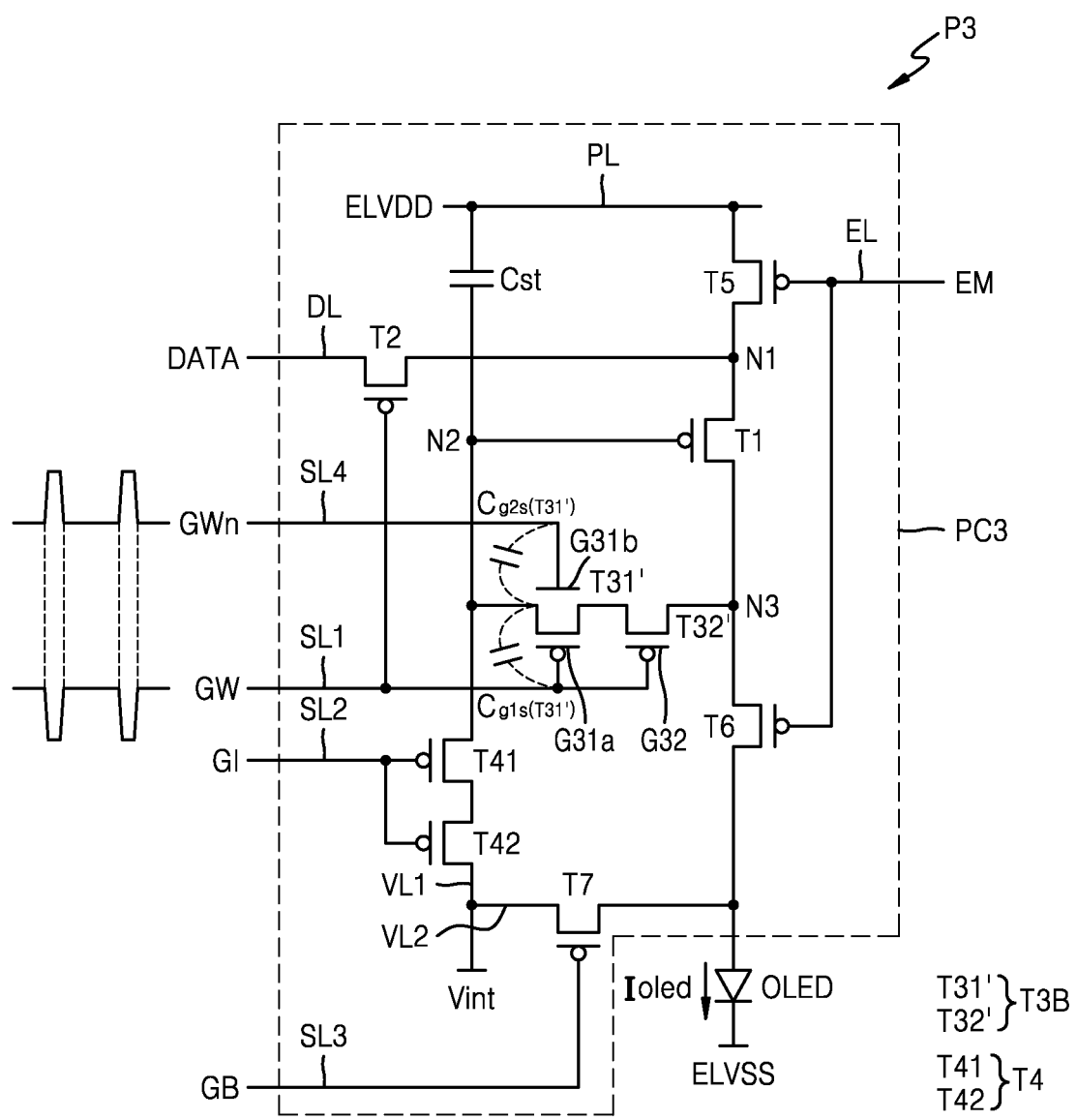
FIG. 9 is an equivalent circuit diagram illustrating a pixel according to an exemplary embodiment of the disclosure.

FIG. 9 is an equivalent circuit diagram illustrating a pixel according to an exemplary embodiment of the disclosure. Structures that are the same as those of the pixel circuit PC2 of FIG. 5 will not be described in detail, and a difference therebetween will be mainly described.

Referring to FIG. 9, a pixel P3 includes the organic light-emitting diode OLED as a display element and a pixel circuit PC3 connected to the organic light-emitting diode OLED. The pixel circuit PC3 includes first to seventh transistors T1, T2, T3B, T4, T5, T6, T7. In an embodiment, the first to seventh transistors T1, T2, T3B, T4, T5, T6, T7 are each implemented by a PMOS transistor. The pixel P3 of FIG. 9 may be driven at a driving timing of FIG. 6.

The pixel circuit PC3 may be connected to the first scan line SL1 transmitting the first scan signal GW, the second scan line SL2 transmitting the second scan signal GI, the third scan line SL3 transmitting the third scan signal GB, the fourth scan line SL4 transmitting the fourth scan signal GWn, the emission control line EL transmitting the emission control signal EM, and the data line DL transmitting the data signal DATA. The pixel circuit PC3 may also be connected to the driving voltage line PL and the first and second initialization voltage lines VL1 and VL2.

The third transistor T3B (a compensation transistor) may include two sub-transistors connected in series. For example, the third transistor T3B may include a 3-1 transistor T31' as a first sub-transistor and a 3-2 transistor T32' as a second sub-transistor.

The 3-1 transistor T31' includes a first gate terminal G31a connected to the first scan line SL1, a second gate terminal G31b connected to the fourth scan line SL4, a first terminal connected to the second node N2, and a second terminal connected to a first terminal of the 3-2 transistor T32'. The 3-2 transistor T32' includes a gate terminal G32 connected to the first scan line SL1, a first terminal connected to the second terminal of the 3-1 transistor T31', and a second terminal connected to the third node N3.

The first gate terminal G31a of the 3-1 transistor T31' may receive the first scan signal GW through the first scan line SL1, and the second gate electrode G31b may receive the fourth scan signal GWn through the fourth scan line SL4. In an exemplary embodiment, the fourth scan signal GWn is an inverted voltage of the first scan signal GW. The fourth scan signal GWn may be applied at the same timing as the first scan signal GW. The gate terminal G32 of the 3-2 transistor T32' may receive the first scan signal GW through the first scan line SL1. The 3-1 transistor T31' and the 3-2 transistor T32' may be simultaneously turned on and may diode-connect the first transistor T1.

In an embodiment, the 3-1 thin-film transistor T31' from among the 3-1 thin-film transistor T31' and the 3-2 transistor T32' of the third transistor T3B of the pixel P3, which is adjacent to the gate terminal of the first transistor T1, may include a pair of gate electrodes. Signals, which are inverted from each other, may be transmitted to the gate electrodes of the 3-1 thin-film transistor T31', respectively. The third transistor T3B may be driven similarly to the third transistor T3A of the pixel P2 of FIGS. 5 and 6. That is, when the second period of time t2 is changed to the third period of time t3, a kick back voltage at the gate terminal of the first transistor T1, which is generated because of a parasitic capacitance $C_{g1s(T31')}$ between the first gate terminal G31a and the source area of the 3-1 transistor T31' may be offset (canceled) by a kick back voltage at the gate terminal of the first transistor T1 which is generated because of a parasitic capacitance $C_{g2s(T31')}$ between the second gate terminal G31b and the source area of the 3-1 transistor T31'. Accordingly, when a pixel displays black and then white or vice versa, because the kick back voltage $\Delta V_{KB}$ at the gate terminal of the first transistor T1 decreases (or becomes zero), afterimages perceived in an image may decrease.

Figure 10:
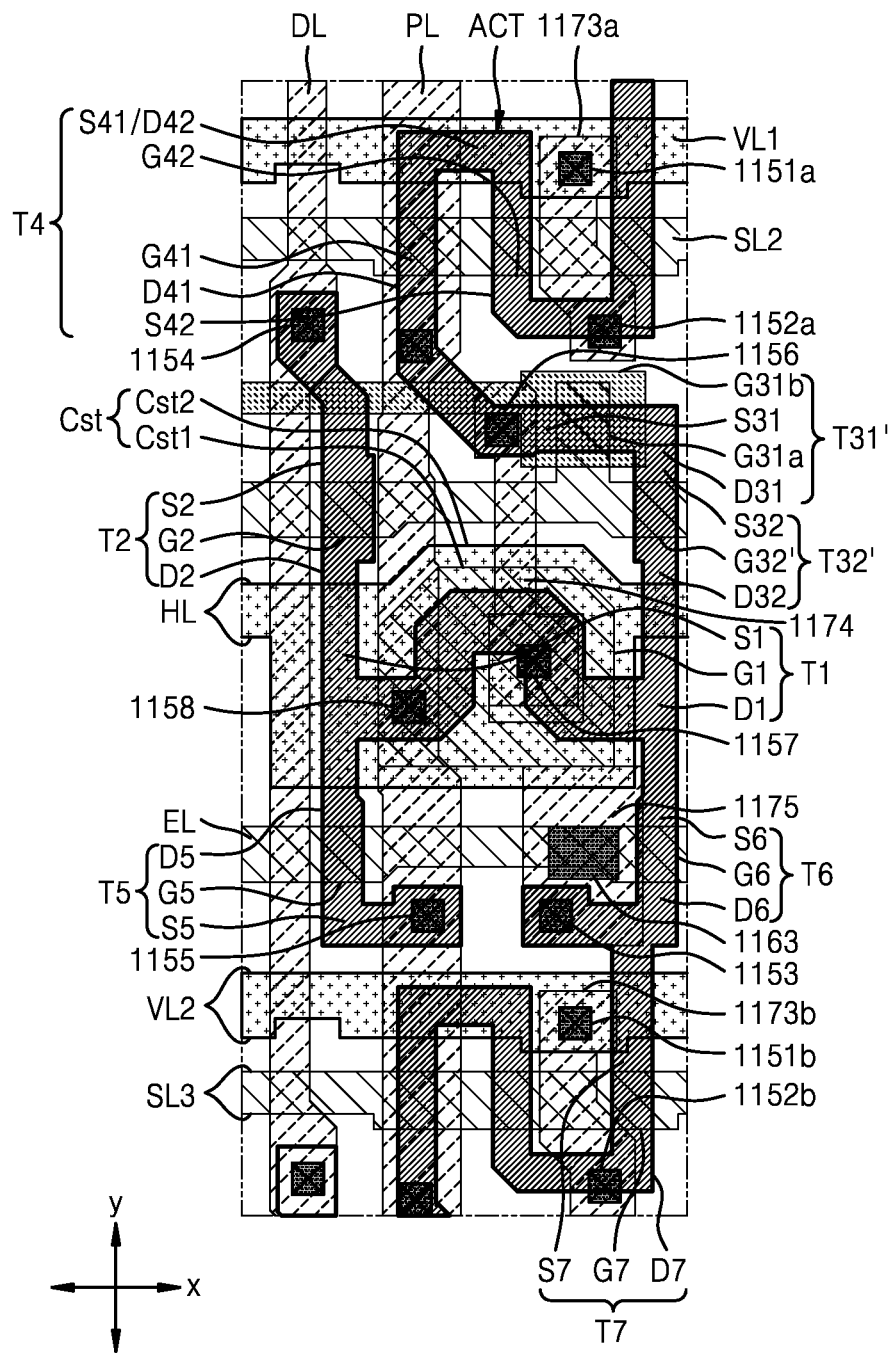
FIG. 10 is a plan view illustrating a pixel circuit of FIG. 9 according to an exemplary embodiment of the disclosure.
Figure 10A:
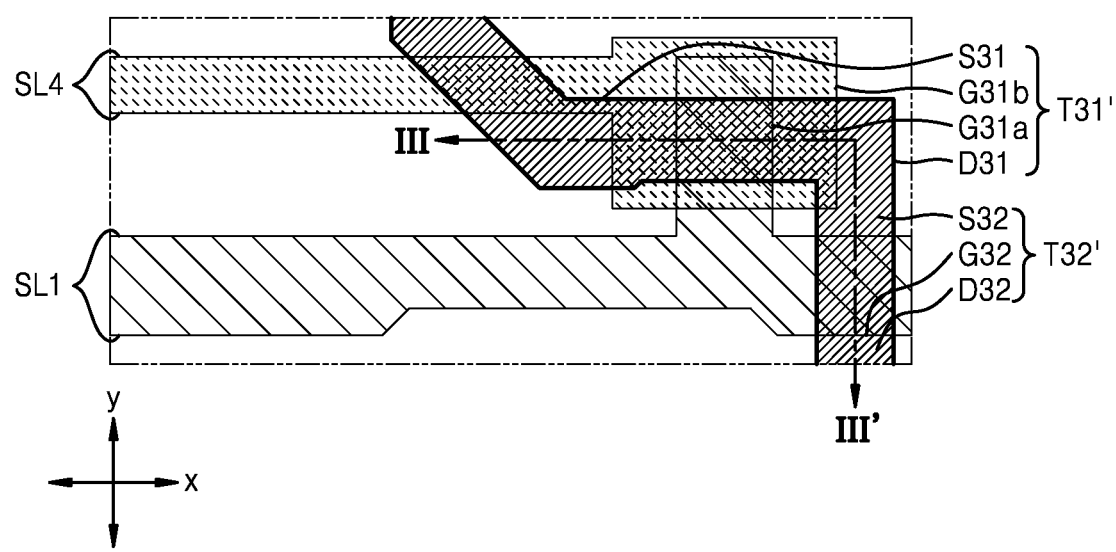
FIG. 10A is an enlarged plan view illustrating a portion of FIG. 10 according to an exemplary embodiment of the disclosure.
Figure 11:
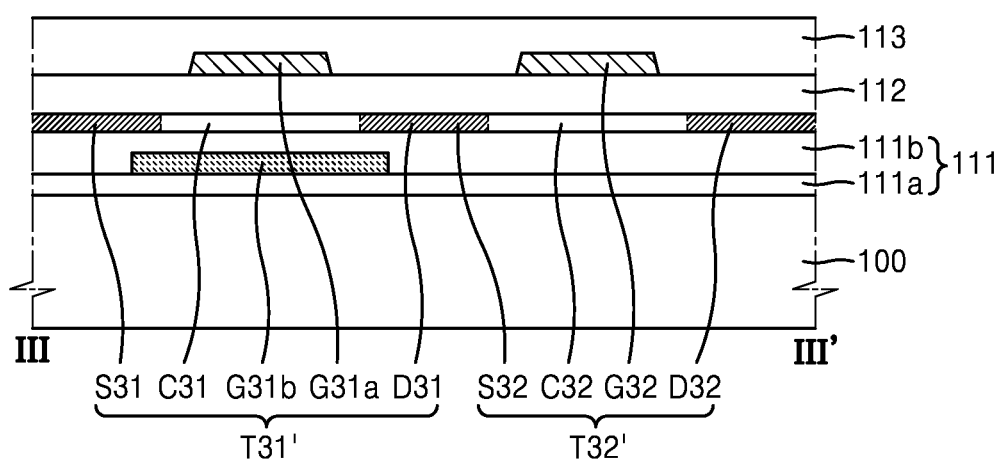
FIG. 11 is a cross-sectional view illustrating a display device taken along a line III-III' of FIG. 10A according to an exemplary embodiment of the disclosure.

FIG. 10 is a plan view illustrating a pixel circuit of FIG. 9 according to an exemplary embodiment of the disclosure. FIG. 10A is an enlarged plan view of a portion of FIG. 10 according to an exemplary embodiment of the disclosure. FIG. 11 is a cross-sectional view taken along a line III-III' of FIG. 10A. FIG. 10 may correspond to a plan view of the pixel circuit PC3 of FIG. 9. Hereinafter, descriptions will be provided with reference to FIGS. 10 and 11, but structures different from those in the plan view and the cross-sectional view of FIGS. 7 and 8B will be mainly described.

The first to seventh transistors T1, T2, T3B, T4, T5, T6, T7 of FIG. 9 may each be implemented as a thin-film transistor. Hereinafter, the first to seventh transistors T1, T2, T3B, T4, T5, T6, T7 will be referred to as first to seventh thin-film transistors T1, T2, T3B, T4, T5, T6, T7 The third thin-film transistor T3B may include two sub-transistors connected in series. For example, the third thin-film transistor T3B may include the 3-1 transistor T31' as the first sub-transistor and the 3-2 transistor T32' as the second sub-transistor. The fourth thin-film transistor T4 may include two sub-thin-film transistors that are connected in series. For example, the fourth thin-film transistor T4 may include a 4-1 transistor T41' as a first sub-transistor and a 4-2 transistor T42' as a second sub-transistor.

The buffer layer 111 may be disposed on the substrate 100. The buffer layer 111 may have a structure in which a first buffer layer 111a and a second buffer layer 111b are stacked. For example, the second buffer layer 111b may be disposed on top of the first buffer layer 111a. In an exemplary embodiment, the first buffer layer 111a and the second buffer layer 112a include different materials. For example, the buffer layer 111a may include a silicon nitride such as $SiN_x$. The second buffer layer 111b may include a silicon oxide such as $SiO_x$.

When the first buffer layer 111a includes silicon nitride, hydrogen may be included during the formation of the silicon nitride, and thus, carrier mobility of the semiconductor layer ACT formed on the buffer layer 111 may be improved. Electrical characteristics of thin-film transistors may be improved accordingly. Also, the semiconductor layer ACT may include a silicon material. An interfacial adhesion between the semiconductor layer ACT including silicon and the second buffer layer 111b including silicon oxide may be improved, and the electrical characteristics of the thin-film transistor may be improved.

The fourth scan line SL4 may be disposed between the substrate 100 and semiconductor layer, for example, the first buffer layer 111a and the second buffer layer 111b. In an exemplary embodiment, the fourth scan line SL4 is disposed between the substrate 100 and the first buffer layer 111a.

The fourth scan line SL4 may include Al, Pt, Pd, Ag, Mg, Au, Ni, Nd, Ir, Cr, Ca, Mo, Ti, W, and/or Cu.

The semiconductor layer ACT may be formed on the buffer layer 111. Some regions of the semiconductor layer ACT may form semiconductor layers of the first to third thin-film transistors T1 to T7, respectively. The semiconductor layer ACT may include a silicon semiconductor. For example, the semiconductor layer ACT may include LTPS.

The semiconductor layers of the first to seventh thin-film transistors T1 to T7 may respectively include the source areas S1 to S7, the drain areas D1 to D7, and the channel areas between the source areas S1 to S7 and the drain areas D1 to D7. FIG. 11 shows the channel area C31 of the 3-1 thin-film transistor T31' and the channel area C32 of the 3-2 thin-film transistor T32'. The first to seventh thin-film transistors T1 to T7 may each be implemented by a PMOS transistor.

The first gate insulating layer 112 may be disposed on the semiconductor layer ACT, the gate electrode G1 of the first thin-film transistor T1, the first scan line SL1, the second scan line SL2, the third scan line SL3, and the emission control line EL may be disposed on the first gate insulating layer 112.

As shown in FIG. 11, the 3-1 thin-film transistor T31' may include the first gate electrode G31a as a top gate electrode, the second gate electrode G31b as a bottom gate electrode, and a semiconductor layer including the source area S31, the channel area C31, and the drain area D31. The second gate electrode G31b of the 3-1 thin-film transistor T31' may be disposed between the substrate 100 and a semiconductor layer, for example, the first buffer layer 111a and the second buffer layer 111b. In an exemplary embodiment, the second gate electrode G31b of the 3-1 thin-film transistor T31' is disposed between the substrate 100 and the first buffer layer 111a. In an exemplary embodiment, the second gate electrode G31b of the 3-1 thin-film transistor T31' is part of the fourth scan line SL4. In an exemplary embodiment, the second gate electrode G31b overlaps with the channel area C31 of the 3-1 thin-film transistor T31'. The second gate electrode G31b may partially overlap with the channel area C31. A region protruding from the first scan line SL1 and overlapping the channel area C31 of the 3-1 thin-film transistor T31' may be the first gate electrode G31a of the 3-1 thin-film transistor T31'.

The 3-2 thin-film transistor T32' includes a semiconductor layer including the gate electrode G32, the source area S32, the channel area C32, and the drain area D32. In an exemplary embodiment, a region of the first scan line SL1, which overlaps the channel area C32 of the 3-2 thin-film transistor T32', is the gate electrode G32 of the 3-2 thin-film transistor T32'.

The second gate insulating layer 113 may be disposed on the gate electrode G1 of the first thin-film transistor T1, the first scan line SL1, the second scan line SL2, the third scan line SL3, and the emission control line EL.

Hereinafter, although not shown in FIG. 11, the descriptions will be provided with reference to FIGS. 8A and 8B.

The electrode voltage line HL, the first initialization voltage line VL1, and the second initialization voltage line VL2 may be disposed on the second gate insulating layer 113.

In an exemplary embodiment, the electrode voltage line HL covers at least part of the gate electrode G1 of the first thin-film transistor T1. In an exemplary embodiment, the electrode voltage line HL entirely covers the gate electrode G1. The electrode voltage line HL may function as the upper electrode Cst2 of the capacitor Cst. The lower electrode Cst1 of the capacitor Cst may be integrally formed with the gate electrode G1. The gate electrode G1 of the first thin-film transistor T1 may function as the lower electrode Cst1 of the capacitor Cst. An opening SOP may be formed in the upper electrode Cst2 of the capacitor Cst.

The interlayer insulating layer 114 may be disposed on the electrode voltage line HL, the first initialization voltage line VL1, and the second initialization voltage line VL2. The data line DL, the driving voltage line PL, a node electrode 1174, and the connection electrodes 1173a, 1173b, and 1175 may be disposed on the interlayer insulating layer 114.

The node electrode 1174 may electrically connect the gate electrode G1 of the first thin-film transistor T1 to the source area S31 of the 3-1 thin-film transistor T31' and the drain area D41 of the 4-1 thin-film transistor T41' through the opening SOP formed in the upper electrode Cst2 of the capacitor Cst. An end of the node electrode 1174 may be electrically connected to the gate electrode G1 of the first thin-film transistor T1 through the contact hole 1157 formed in the second gate insulating layer 113 and the interlayer insulating layer 114. The other end of the node electrode 1174 may be electrically connected to the source area S31 of the 3-1 thin-film transistor T31' through the contact hole 1156 formed in the first gate insulating layer 112, the second gate insulating layer 113, and the interlayer insulating layer 114.

The planarization layer 115 may be disposed on the data line DL, the driving voltage line PL, the node electrode 1174, and the connection electrodes 1173a, 1173b, and 1175, and the organic light-emitting diode OLED may be disposed on the planarization layer 115.

Referring to FIG. 10, the first initialization voltage line VL1, the second scan line SL2, the second initialization voltage line VL2, and the third scan line SL3 may be shared by two pixel circuits PC3 that are adjacent to each other in the second direction.

That is, the first initialization voltage line VL1 and the second scan line SL2 may be electrically connected to a seventh thin-film transistor of a different pixel circuit PC3 that is adjacent to an upper side of the pixel circuit PC3 of FIG. 10 in the second direction shown in the drawing. Therefore, the second scan signal GI transmitted to the second scan line SL2 may be transmitted to a seventh thin-film transistor of the different pixel circuit PC3 as a third scan signal. Likewise, the second initialization voltage line VL2 and the third scan line SL3 may be electrically connected to a fourth thin-film transistor of a different pixel circuit PC3 that is adjacent to a lower side of the pixel circuit PC3 of FIG. 10 in the second direction in the drawing. Therefore, the third scan signal GB transmitted to the third scan line SL3 may be transmitted to a fourth thin-film transistor of the different pixel circuit PC3 as a second scan signal.

Figure 12:
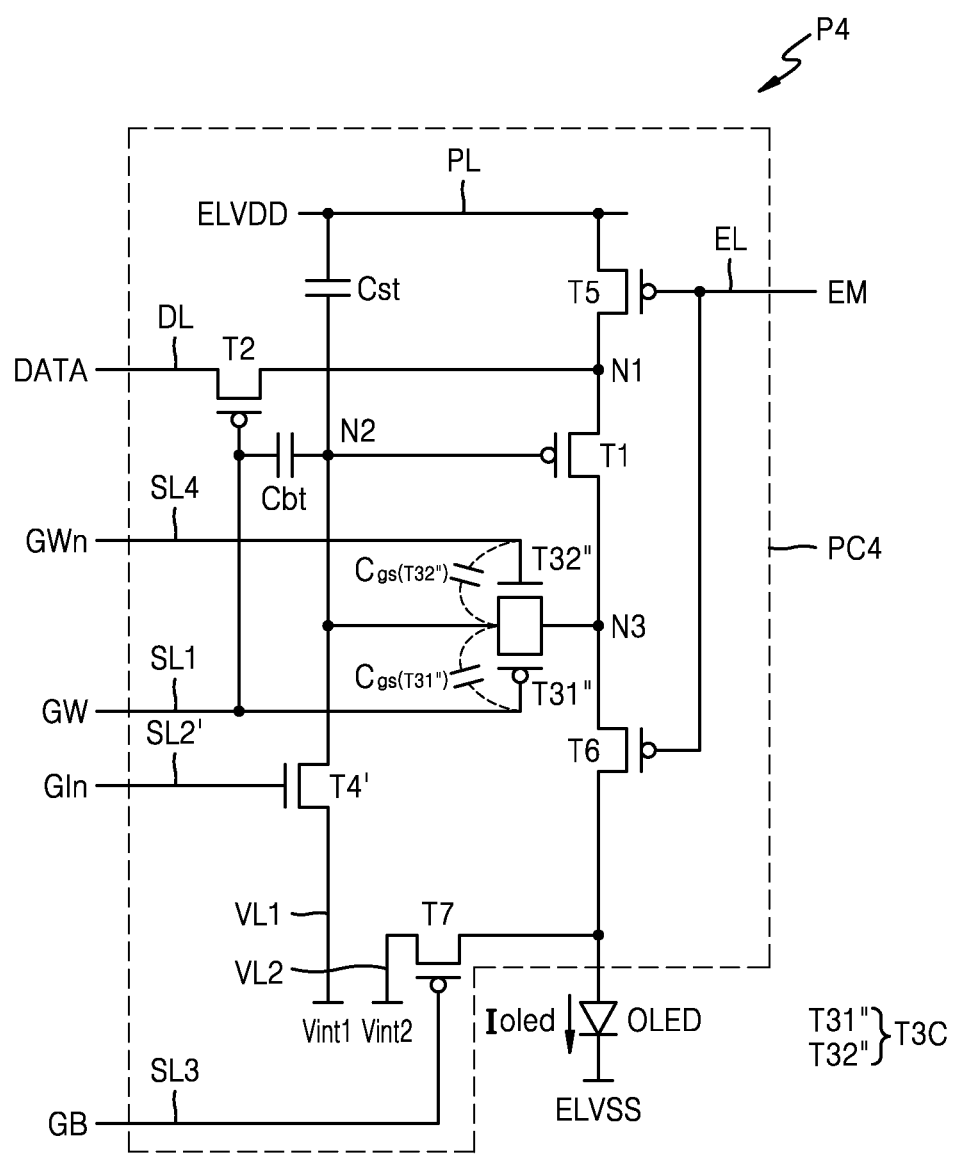
FIG. 12 is an equivalent circuit diagram illustrating a pixel according to an exemplary embodiment of the disclosure.

FIG. 12 is an equivalent circuit diagram illustrating a pixel according to an exemplary embodiment of the disclosure. Hereinafter, a structure that is the same as the structure of the pixel circuit PC2 of FIG. 5 will not be described in detail, and a difference therebetween will be mainly described.

Referring to FIG. 12, a pixel P4 includes the organic light-emitting diode OLED as a display element and a pixel circuit PC4 connected to the organic light-emitting diode OLED. The pixel circuit PC4 includes first to seventh transistors T1, T2, T3C, T4', T5, T6, T7, the first capacitor Cst, and a second capacitor Cbt. In an embodiment, a 3-2 transistor T32" and a fourth transistor T4' of the first to seventh transistors T1, T2, T3C, T4', T5, T6, T7 is each implemented by an NMOS transistor, and the others thereof are implemented by a PMOS transistor. The pixel P4 of FIG. 12 may be driven at a driving timing of FIG. 6.

The pixel circuit PC4 may be connected to the first scan line SL1 transmitting the first scan signal GW, a second scan line SL2' transmitting a second scan signal GIn, the third scan line SL3 transmitting the third scan signal GB, the fourth scan line SL4 transmitting the fourth scan signal GWn, the emission control line EL transmitting the emission control signal EM, and the data line DL transmitting the data signal DATA. The pixel circuit PC4 may also be connected to the driving voltage line PL and the first and second initialization voltage lines VL1 and VL2.

A third transistor T3C (a compensation transistor) may include two sub-transistors that are connected in parallel. For example, the third transistor T3C may include a 3-1 transistor T31" as a first sub-transistor and a 3-2 transistor T32" as a second sub-transistor. The 3-1 transistor T31" may be an NMOS transistor, and the 3-2 transistor T32" may be a PMOS transistor.

The 3-1 transistor T31" includes a gate terminal connected to the first scan line SL1, a first terminal connected to the second node N2, and a second terminal connected to the third node N3. The 3-2 transistor T32" includes a gate terminal connected to the fourth scan line SL4, a first terminal connected to the second node N2, and a second terminal connected to the third node N3. The 3-1 transistor T31" may be turned on in response to the first scan signal GW transmitted through the first scan line SL1, and the 3-2 transistor T32" may be turned on in response to the fourth scan signal GWn transmitted through the fourth scan line SL4. In an exemplary embodiment, the fourth scan signal GWn is an inverted signal of the first scan signal GW. The 3-1 transistor T31" and the 3-2 transistor T32" may be simultaneously turned on to diode-connect the first transistor T1.

The fourth transistor T4' (the first initialization transistor) includes a gate terminal connected to the second scan line SL2', a first terminal connected to the first initialization voltage line VL1, and a second terminal connected to the second node N2. The fourth transistor T4' may be turned on in response to the second scan signal Gin transmitted through the second scan line SL2' and may transmit a first initialization voltage Vint1 to the gate terminal of the first transistor T1, thereby initializing the gate voltage of the first transistor T1. In an exemplary embodiment, the second scan signal GIn is an inverted signal of the first scan signal GW.

The seventh transistor T7 (the second initialization transistor) includes the gate terminal connected to the third scan line SL3, a first terminal connected to the second terminal of the sixth transistor T6 and the pixel electrode of the organic light-emitting diode OLED, and the second terminal connected to the second initialization voltage line VL2. The seventh transistor T7 may be turned on in response to the third scan signal GB transmitted through the third scan line SL3 and transmit the second initialization voltage Vint2 to the pixel electrode of the organic light-emitting diode OLED, thereby initializing the voltage of the pixel electrode of the organic light-emitting diode OLED. In an exemplary embodiment of the disclosure, the seventh transistor T7 is omitted.

The first capacitor Cst includes a first electrode connected to the second node N2 and a second electrode connected to the driving voltage line PL. The first capacitor Cst may store and maintain a voltage corresponding to a difference between the driving voltage line PL and both ends of the gate electrode of the first transistor T1 and thus may maintain a voltage applied to the gate electrode of the first transistor T1.

The second capacitor Cbt includes a third electrode connected to the first scan line SL1 and the gate terminal of the second transistor T2 and a fourth electrode connected to the first electrode of the first capacitor Cst and the gate terminal of the first transistor T1. When the first scan signal GW of the first scan line SL1 has a voltage for turning off the second transistor T2, the second capacitor Cbt may be a boosting capacitor and decrease a voltage (a black voltage) used to display black by increasing the voltage of the second node N2.

In an exemplary embodiment of the disclosure, at least one of the first to seventh transistors T1, T2, T3C, T4', T5, T6, T7 includes a semiconductor layer including an oxide, and the others thereof include semiconductor layers including silicon.

For example, the first transistor T1 directly affecting the brightness of the display device, may include a semiconductor layer having high reliability and including polycrystalline silicon, and thus, a high-resolution display device may be realized.

Because the oxide semiconductor has high carrier mobility and a low leakage current, a voltage may not significantly drop despite a long driving time. That is, because colors of images may not greatly change according to a voltage drop despite the operation in a low frequency, the display device may operate in the low frequency. In an exemplary embodiment of the disclosure, at least one of the 3-1 transistor T31" and the fourth transistor T4', which are connected to the gate electrode of the first transistor T1, is employed as an oxide semiconductor to prevent a leakage current from flowing to the gate terminal of the first transistor T1, since an oxide semiconductor has a small leakage current. The use of the oxide semiconductor may also decrease the power consumption.

In an exemplary embodiment of the disclosure, the 3-2 transistor T32", which includes a semiconductor layer including silicon and is embodied as a PMOS transistor, may be connected in parallel to the 3-1 transistor T31" that includes a semiconductor layer including oxide and is embodied as an NMOS transistor. The third transistor T3C may be driven similarly to the third transistor T3A of the pixel P2 of FIGS. 5 and 6. That is, a kick back voltage at the gate terminal of the first transistor T1, which is generated due to a parasitic capacitance $Cgs_{(T31")}$ of the 3-1 transistor T31", may be offset (canceled) due to a kick back voltage at the gate terminal, which is generated due to a parasitic capacitance $Cgs_{(T32")}$ of the 3-2 transistor T32". Accordingly, when a pixel displays black and then white or vice versa, because the kick back voltage $\Delta V_{KB}$ at the gate terminal of the first transistor T1 decreases (or becomes zero), afterimages perceived in an image may decrease.

Figure 13:
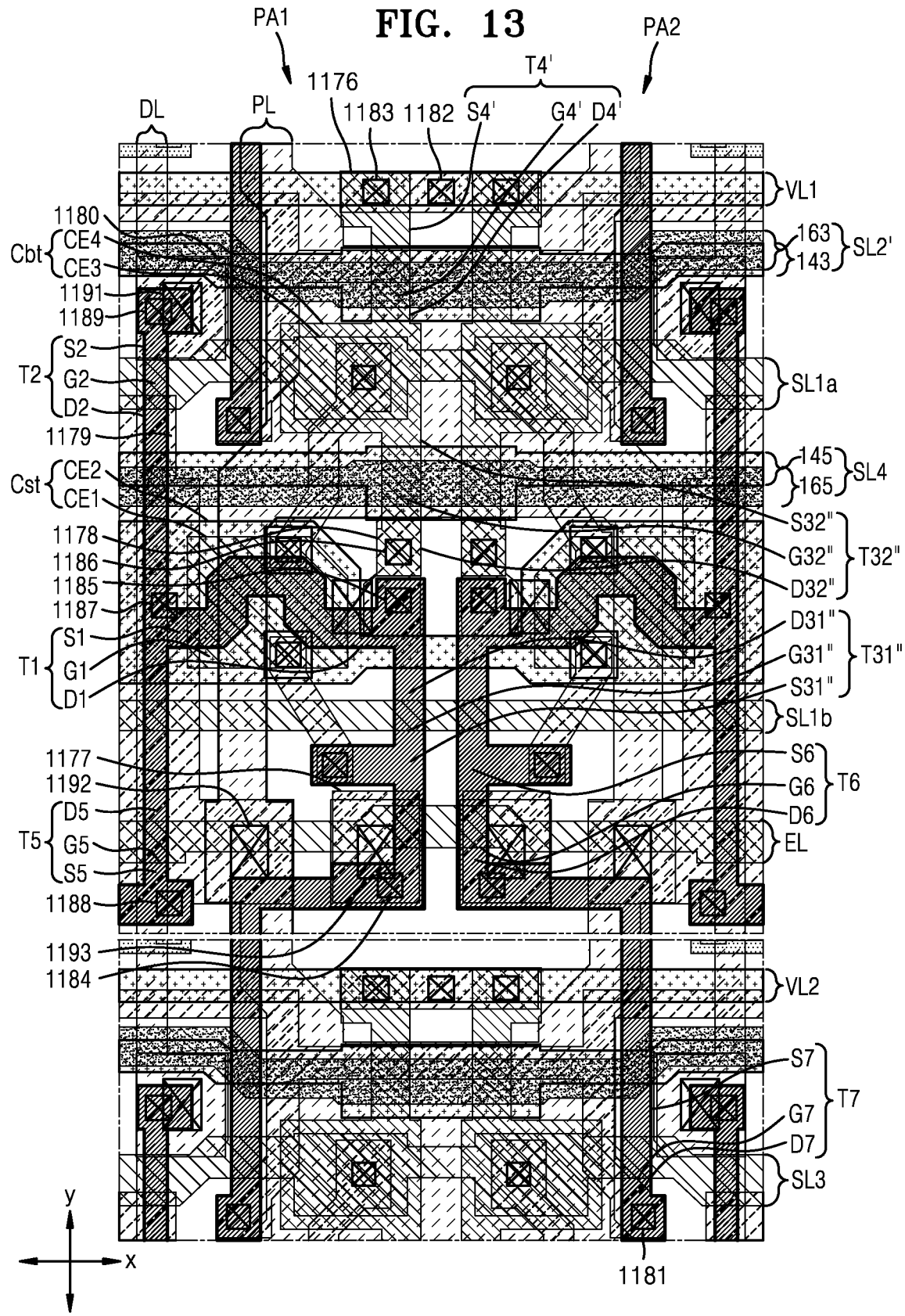
FIG. 13 is a plan view illustrating a pixel circuit of FIG. 12 according to an exemplary embodiment of the disclosure.
Figure 13A:
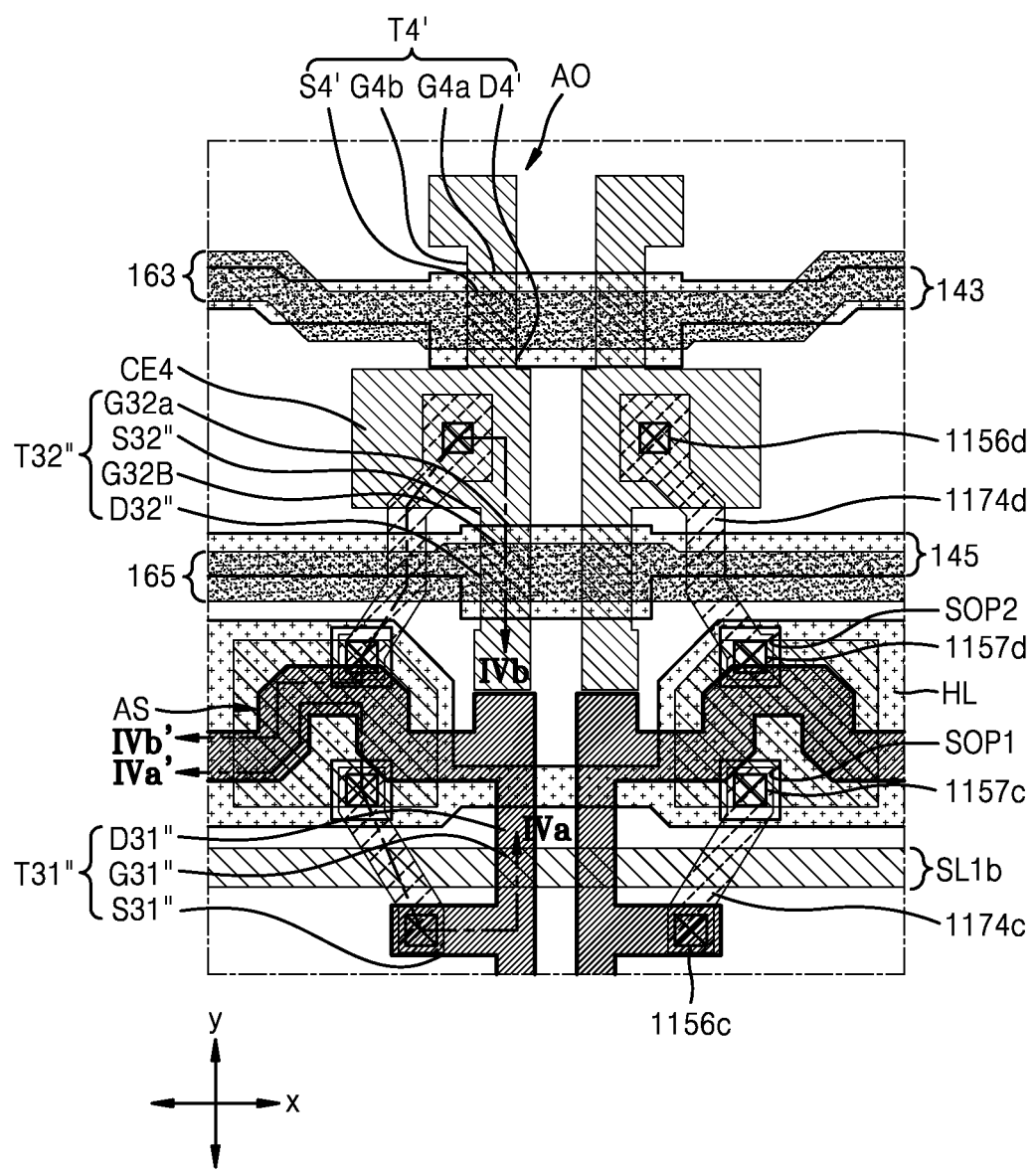
FIG. 13A is an enlarged plan view illustrating a portion of FIG. 13 according to an exemplary embodiment of the disclosure.
Figure 14A:
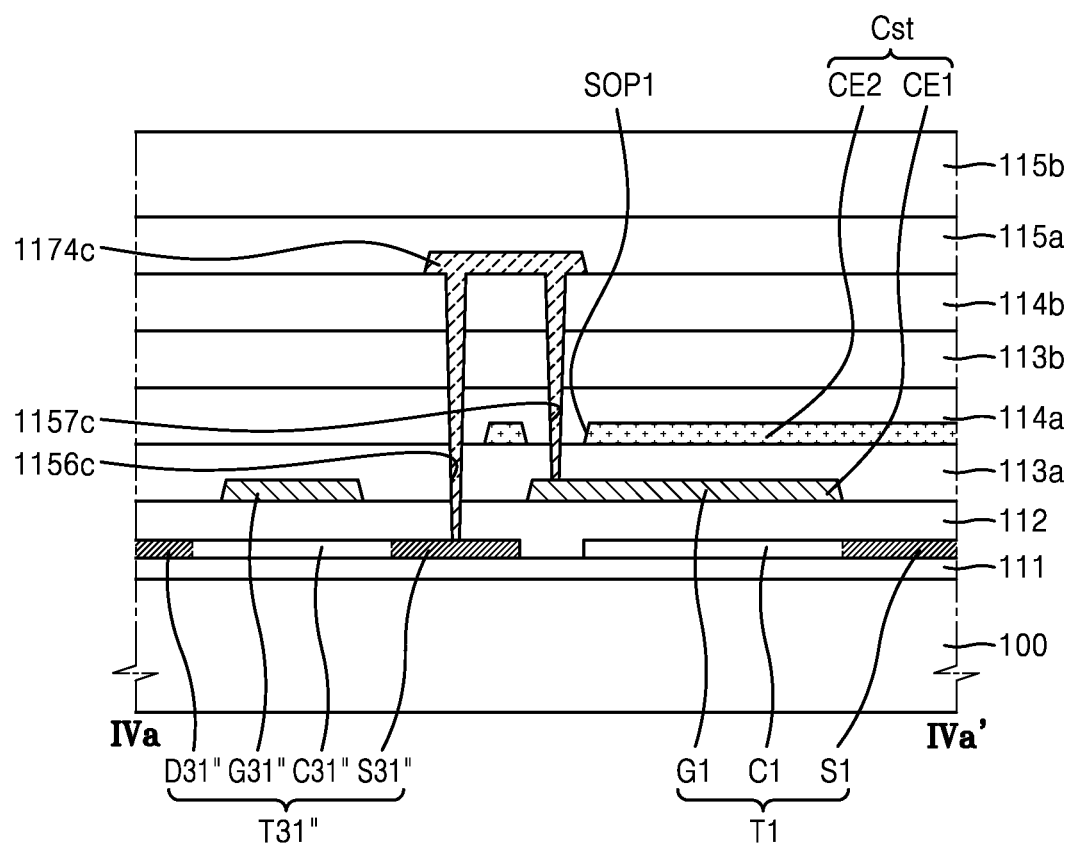
FIGS. 14A and 14B are cross-sectional views illustrating a display device taken along lines IVa-IVa' and IVb-IVb' of FIG. 13A according to an exemplary embodiment of the disclosure.
Figure 14B:
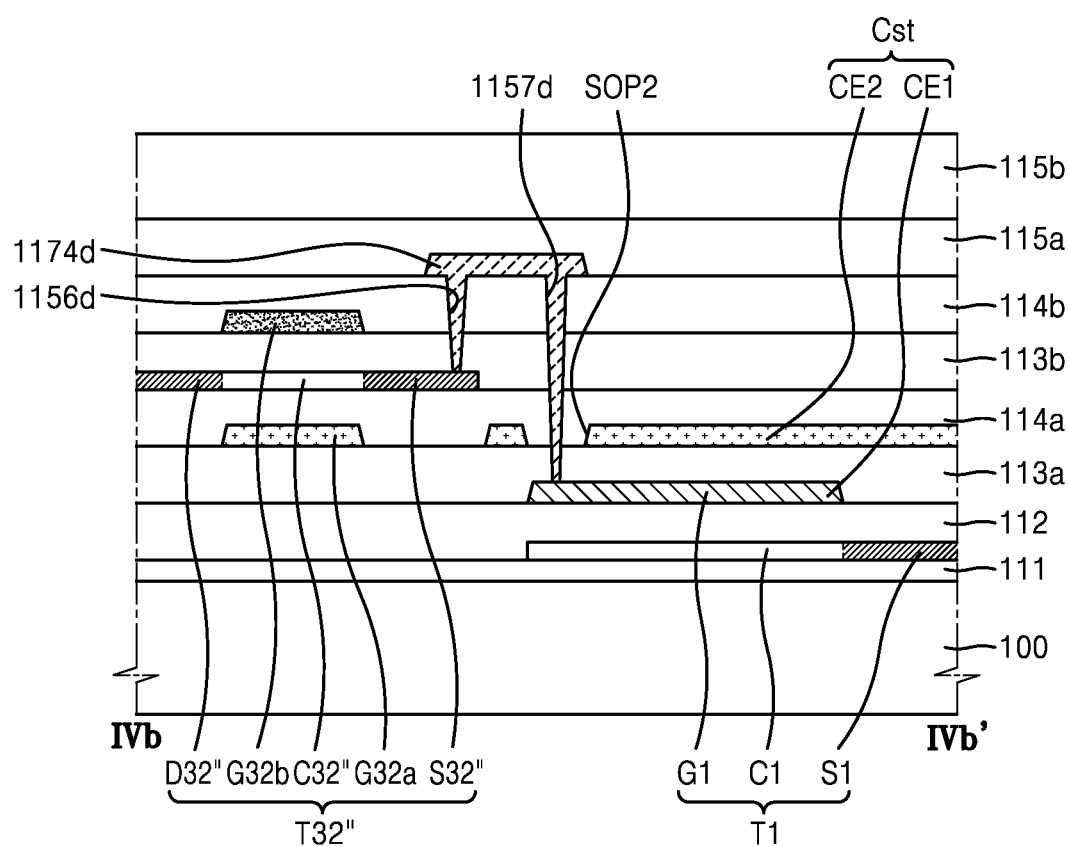

FIG. 13 is a plan view illustrating a pair of pixel circuits arranged in the same row of adjacent columns, according to an exemplary embodiment of the disclosure. FIG. 13A is an enlarged plan view of a portion of FIG. 13 according to an exemplary embodiment of the disclosure. FIGS. 14A and 14B are cross-sectional views taken along lines IVa-IVa' and IVb-IVb' of FIG. 13A. FIG. 13 may correspond to the plan view of the pixel circuit PC4 of FIG. 12. Hereinafter, the descriptions are provided with reference to FIGS. 13 to 14B, but structures different from those in the plan view and the cross-sectional view of FIGS. 7 and 8B will be mainly described.

A pixel circuit of a pixel arranged in a left-side pixel area PA1 of FIG. 13 may be symmetrical to a pixel circuit of pixel horizontally arranged in a right-side pixel area PA2.

In an embodiment, the first transistor T1, the second transistor T2, the 3-1 transistor T31", the fifth transistor T5, the sixth transistor T6, and the seventh transistor T7 are each a thin-film transistor including a silicon semiconductor. The 3-2 transistor T32" and the fourth transistor T4' may each be a thin-film transistor including an oxide semiconductor. Hereinafter, they will be described as first to seventh thin-film transistors T1, T2, T3C, T4', T5, T6, T7. The third thin-film transistor T3C may include two sub-transistors (e.g., thin film transistors) connected in parallel. For example, the third thin-film transistor T3C may include the 3-1 transistor T31" as the first sub-transistor and the 3-2 transistor T32" as the second sub-transistor.

The buffer layer 111 may be disposed on the substrate 100. A first semiconductor layer AS (see FIG. 13A) may be disposed on the buffer layer 111. Some regions of the first semiconductor layer AS may respectively form semiconductor layers of the first thin-film transistor T1, the second thin-film transistor T2, the 3-1 thin-film transistor T31", the fifth thin-film transistor T5, the sixth thin-film transistor T6, and the seventh thin-film transistor T7. The first semiconductor layer AS may include a silicon semiconductor. For example, the first semiconductor layer AS may include LTPS. The semiconductor layers of the first thin-film transistor T1, the second thin-film transistor T2, the 3-1 thin-film transistor T31", the fifth thin-film transistor T5, the sixth thin-film transistor T6, and the seventh thin-film transistor T7 may be connected to each other and may be bent in various shapes.

The semiconductor layers of the first thin-film transistor T1, the second thin-film transistor T2, the 3-1 thin-film transistor T31", the fifth thin-film transistor T5, the sixth thin-film transistor T6, and the seventh thin-film transistor T7 may respectively include source areas S1, S2, S31", S5, S6, S7, drain areas D1, D2, D31", D5, D6, D7, and channel areas therebetween. The source area and the drain area may be doped with impurities and may include P-type impurities. FIG. 14A shows the channel area C1 of the first thin-film transistor T1 and the channel area C31" of the 3-1 thin-film transistor T31".

The first gate insulating layer 112 may be disposed on the first semiconductor layer AS.

The first scan line SL1, the third scan line SL3, and the emission control line EL may extend in the first direction on the first gate insulating layer 112. On the first gate insulating layer 112, and the gate electrode G1 of the first thin-film transistor T1 may be disposed and may have an isolated pattern. The first scan line SL1 may include a pair of a 1-1 scan line SL1a and a 1-2 scan line SL1b that are branched with the first thin-film transistor T1 therebetween.

A region of the 1-1 scan line SL1a that overlaps the channel area of the second thin-film transistor T2, wherein the 1-1 scan line SL1a is disposed at an upper side of the first thin-film transistor T1, may be the gate electrode G2 of the second thin-film transistor T2. A region of the 1-2 scan line SL1b that overlaps the channel area of the 3-1 thin-film transistor T31", wherein the 1-2 scan line SL1b is disposed at a lower side of the first thin-film transistor T1, may be the gate electrode G31" of the 3-1 thin-film transistor T31". In an exemplary embodiment, a region of the third scan line SL3, which overlaps the channel area of the seventh thin-film transistor T7, is the gate electrode G7 of the seventh thin-film transistor T7. Regions of the emission control line EL, which overlap the channel areas of the fifth and sixth thin-film transistors T5 and T6, may be the gate electrodes G5 and G6 of the fifth and sixth thin-film transistors T5 and T6. In an exemplary embodiment, part of the 1-1 scan line SL1a is the third electrode CE3 of the second capacitor Cbt.

The first scan line SL1, the third scan line SL3, and the emission control line EL may each include Al, Pt, Pd, Ag, Mg, Au, Ni, Nd, Ir, Cr, Li, Ca, Mo, Ti, W, or Cu, and may be a single layer or several layers including one or more materials.

The second gate insulating layer 113a may be disposed on the first scan line SL1, the third scan line SL3, and the emission control line EL.

The electrode voltage line HL, the first initialization voltage line VL1, a lower scan line 143 of the second scan line SL2', and a lower scan line 145 of the fourth scan line SL4 may be disposed on the second gate insulating layer 113a.

The electrode voltage line HL may cover at least some portions of the gate electrode G1 of the first thin-film transistor T1. In an exemplary embodiment, the electrode voltage line HL covers all of the gate electrode G1. The electrode voltage line HL may function as the second electrode CE2 of the first capacitor Cst.

In an exemplary embodiment, the first capacitor Cst overlaps the first thin-film transistor T1. The first capacitor Cst includes the first electrode CE1 and the second electrode CE2. The gate electrode G1 of the first thin-film transistor T1 may function as a control electrode as well as the first electrode CE1 of the first capacitor Cst. The second electrode CE2 of the first capacitor Cst may overlap the first electrode CE1 thereof with the second gate insulating layer 113a therebetween.

The second electrode CE2 of the first capacitor Cst may include the first opening SOP1 and the second opening SOP2. The first opening SOP1 and the second opening SOP2 formed by part of the second electrode CE2 being removed may have closed shapes.

The electrode voltage line HL, the first initialization voltage line VL1, the lower scan line 143 of the second scan line SL2', and the lower scan line 145 of the fourth scan line SL4 may each include Al, Pt, Pd, Ag, Mg, Au, Ni, Nd, Ir, Cr, Li, Ca, Mo, Ti, W, or Cu and may be a single layer or several layers including one or more of the above materials.

On the second gate insulating layer 113a, the first interlayer insulating layer 114a may be disposed.

On the first interlayer insulating layer 114a, a second semiconductor layer AO (see FIG. 13A) including an oxide semiconductor may be disposed. Some regions of the second semiconductor layer AO may respectively form the semiconductor layers of the 3-2 thin-film transistor T32" and the fourth thin-film transistor T4'. The second semiconductor layer AO may include a Zn oxide-based material such as Zn oxide, In—Zn oxide, or Ga—In—Zn oxide. In some embodiments, the second semiconductor layer AO may include an In—Ga—Zn—O (IGZO) semiconductor, an In—Sn—Zn—O (ITZO) semiconductor, or an In—Ga—Sn—Zn—O (IGTZO) semiconductor in which metal such as indium (In), gallium (Ga), and tin (Sn) is included in ZnO.

The semiconductor layers of the 3-2 thin-film transistor T32" and the fourth thin-film transistor T4 may include the channel areas, the source areas S32" and S4', and the drain areas D32" and D4' on both ends of respective channel areas. FIG. 14B shows the channel area C32" of the 3-2 thin-film transistor T32". The source areas and the drain areas of the 3-2 thin-film transistor T32" and the fourth thin-film transistor T4 may be formed by adjusting a carrier concentration of the oxide semiconductor and making them conductive. For example, the source areas and the drain areas of the 3-2 thin-film transistor T32" and the fourth thin-film transistor T4 may formed by increasing the carrier concentration through a plasma treatment using a hydrogen-based gas, a fluorine-based gas, or a combination thereof.

Part of the second semiconductor layer AO may be the fourth electrode CE4 of the second capacitor Cbt. The fourth electrode CE4 may extend from the semiconductor layer of the 3-2 thin-film transistor T32" or the semiconductor layer of the fourth thin-film transistor T4'. That is, the fourth electrode CE4 may include an oxide semiconductor and may be disposed on the first interlayer insulating layer 114a. In an exemplary embodiment, the fourth electrode CE4 of the second capacitor Cbt overlaps the third electrode CE3. The second capacitor Cbt may be disposed between the 3-2 thin-film transistor T32" and the fourth thin-film transistor T4" in a plan view.

The third gate insulating layer 113b may be disposed on the second semiconductor layer AO, and on the third gate insulating layer 113b, the upper scan line 163 of the second scan line SL2' and the upper scan line 165 of the fourth scan line SL4 may extend in the first direction. The upper scan line 163 of the second scan line SL2' may overlap at least part of the lower scan line 143. The upper scan line 165 of the fourth scan line SL4 may overlap at least part of the lower scan line 145. That is, the second scan line SL2' and the fourth scan line SL4 may be two conductive layers disposed at different layers.

As shown in FIG. 13A, a region of the lower scan line 143 of the second scan line SL2', which overlaps the second semiconductor layer AO, may be a lower gate electrode G4a of the fourth thin-film transistor T4'. A region of the upper scan line 163 of the second scan line SL2', which overlaps the second semiconductor layer AO, may be an upper gate electrode G4b of the fourth thin-film transistor T4'. Also, a region of the lower scan line 145 of the fourth scan line SL4, which overlaps the second semiconductor layer AO, may be a lower gate electrode G32a of the 3-2 thin-film transistor T32". A region of the upper scan line 165 of the fourth scan line SL4, which overlaps the second semiconductor layer AO, may be an upper gate electrode G32b of the 3-2 thin-film transistor T32". That is, the 3-2 thin-film transistor T32" and the fourth thin-film transistor T4' may have a double-gate structure in which control electrodes are disposed on and under the semiconductor layer.

The upper gate electrode G32b of the 3-2 thin-film transistor T32" and the upper gate electrode G4b of the fourth thin-film transistor T4' may each be a single layer or several layers including at least one of Mo, Cu, and Ti.

The second interlayer insulating layer 114b may cover the 3-2 thin-film transistor T32" and the fourth thin-film transistor T4'. On the second interlayer insulating layer 114b, the second initialization voltage line VL2, the first and second node electrodes 1174c and 1174d, and connection electrodes 1176, 1177, 1178, 1179, and 1180 may be disposed.

The second initialization voltage line VL2 may be connected to the source area S7 of the seventh thin-film transistor T7 through a contact hole 1181 formed in the first gate insulating layer 112, the second gate insulating layer 113a, the first interlayer insulating layer 114a, the third gate insulating layer 113b, and the second interlayer insulating layer 114b.

As shown in FIGS. 13A and 14A, the first node electrode 1174c may electrically connect the gate electrode G1 of the first thin-film transistor T1 to the source area S31" of the 3-1 thin-film transistor T31" through the first opening SOP1 formed in the second electrode CE2 of the capacitor Cst. An end of the first node electrode 1174c may be electrically connected to the gate electrode G1 of the first thin-film transistor T1 through a contact hole 1157c formed in the second gate insulating layer 113a, the first interlayer insulating layer 114a, the third gate insulating layer 113b, and the second interlayer insulating layer 114b. The other end of the first node electrode 1174c may be electrically connected to the source area S31" of the 3-1 thin-film transistor T31" through a contact hole 1156c formed in the first gate insulating layer 112, the second gate insulating layer 113a, the first interlayer insulating layer 114a, the third gate insulating layer 113b, and the second interlayer insulating layer 114b.

As shown in FIGS. 13A and 14B, the second node electrode 1174d may electrically connect the gate electrode G1 of the first thin-film transistor T1 to the source area S32" of the 3-2 thin-film transistor T32" through the second opening SOP2 formed in the second electrode CE2 of the capacitor Cst. An end of the second node electrode 1174d may be electrically connected to the gate electrode G1 of the first thin-film transistor T1 through a contact hole 1157d formed in the second gate insulating layer 113a, the first interlayer insulating layer 114a, the third gate insulating layer 113b, and the second interlayer insulating layer 114b. The other end of the second node electrode 1174d may be electrically connected to the source area S32" of the 3-2 thin-film transistor T32" through a contact hole 1156d formed in the third gate insulating layer 113b and the interlayer insulating layer 114.

The connection electrode 1176 may be electrically connected to the first initialization voltage line VL1 through a contact hole 1182 formed in the first interlayer insulating layer 114a, the third gate insulating layer 113b, and the second interlayer insulating layer 114b. The connection electrode 1176 may be electrically connected to the source area S4' of the fourth thin-film transistor T4 through a contact hole 1183 formed in the third gate insulating layer 113b and the second interlayer insulating layer 114b.

The connection electrode 1177 may be electrically connected to the drain area D6 of the sixth thin-film transistor T6 through a contact hole 1184 formed in the first gate insulating layer 112, the second gate insulating layer 113a, the first interlayer insulating layer 114a, the third gate insulating layer 113b, and the second interlayer insulating layer 114b.

An end of the connection electrode 1178 may be electrically connected to the drain area D31" of the 3-1 thin-film transistor T31" through a contact hole 1185 formed in the first gate insulating layer 112, the second gate insulating layer 113a, the first interlayer insulating layer 114a, the third gate insulating layer 113b, and the second interlayer insulating layer 114b. The other end of the connection electrode 1178 may be electrically connected to the drain area D32" of the 3-2 thin-film transistor T32" through a contact hole 1186 formed in the third gate insulating layer 113b and the second interlayer insulating layer 114b.

An end of the connection electrode 1179 may be electrically connected to the second electrode CE2 of the first capacitor Cst through a contact hole 1187 formed in the first interlayer insulating layer 114a, the third gate insulating layer 113b, and the second interlayer insulating layer 114b. The other end of the connection electrode 1179 may be electrically connected to the source area D5 of the fifth thin-film transistor T5 through a contact hole 1188 formed in the first gate insulating layer 112, the second gate insulating layer 113a, the first interlayer insulating layer 114a, the third gate insulating layer 113b, and the second interlayer insulating layer 114b.

The connection electrode 1180 may be electrically connected to the source electrode S2 of the second thin-film transistor T2 through a contact hole 1189 formed in the first gate insulating layer 112, the second gate insulating layer 113a, the first interlayer insulating layer 114a, the third gate insulating layer 113b, and the second interlayer insulating layer 114b.

The first, second, and third gate insulating layers 112, 113a, and 113b may each include an inorganic material such as oxide or nitride. For example, the first, second, and third gate insulating layers 112, 113a, and 113b may each include at least one of $SiO_2$, $SiN_x$, $SiON$, $Al_2O_3$, $TiO_2$, $Ta_2O_5$, $HfO_2$, or $ZnO_2$.

The first and second interlayer insulating layers 114a and 114b may each include an inorganic material such as oxide or nitride. For example, the first and second interlayer insulating layers 114a and 114b may each include at least one of $SiO_2$, $SiN_x$, $SiON$, $Al_2O_3$, $TiO_2$, $Ta_2O_5$, $HfO_2$, and $ZnO_2$.

The second initialization voltage line VL2, the first and second node electrodes 1174c and 1174d, and the connection electrodes 1176, 1177, 1178, 1179, and 1180 may each include a highly conductive material such as metal and a conductive oxide. For example, the second initialization voltage line VL2, the first and second node electrodes 1174c and 1174d, and the connection electrodes 1176, 1177, 1178, 1179, and 1180 may each be a single layer or several layers including at least one of Al, Cu, and Ti.

The fourth electrode CE4 of the second capacitor Cbt may be connected to the second node electrode 1174d and may be electrically connected to the first gate electrode G1.

A first planarization layer 115a may be disposed on the second interlayer insulating layer 114b, and the data line DL and the driving voltage line PL may be disposed on the first planarization layer 115a.

As the data line DL is electrically connected to the connection electrode 1180 through a contact hole 1191 formed in the first planarization layer 115a, the data line DL may be electrically connected to the source area S2 of the second thin-film transistor T2.

As the driving voltage line PL is electrically connected to the connection electrode 1177 through a contact hole 1192 formed in the first planarization layer 115a, the driving voltage line PL may be electrically connected to the source area S5 of the fifth thin-film transistor T5. The driving voltage line PL may cover the second semiconductor layer AO and may block light that may enter from over the substrate 100.

The data line DL and the driving voltage line PL may each be a single layer or several layers including at least one of Al, Cu, and Ti.

A second planarization layer 115b may be disposed on the first planarization layer 115a, and the organic light-emitting diode OLED may be disposed on the second planarization layer 115b. The pixel electrode of the organic light-emitting diode OLED may be electrically connected to the drain area D6 of the sixth thin-film transistor T6 through at least one of the connection electrodes 1177 and 1193 thereunder. The connection electrode 1193 may be electrically connected to the connection electrode 1177 through a contact hole formed in the second planarization layer 115b.

The first planarization layer 115a and the second planarization layer 115b may each include an organic material such as acryl, BCB, PI, or HMDSO. Alternatively, the first planarization layer 115a and the second planarization layer 115b may each include an inorganic material. The first planarization layer 115a and the second planarization layer 115b may each include a single layer or several layers. A pixel-defining layer may be disposed on the second planarization layer 115b.

Referring to FIG. 13, the 1-1 scan line SL1a and the third scan line SL3 may be shared by two pixel circuits PC4 that are adjacent to each other in the second direction.

That is, the 1-1 scan line SL1a may be electrically connected to a seventh thin-film transistor of a different pixel circuit PC4 that is adjacent to an upper side of the pixel circuit PC4 of FIG. 13 in the second direction shown in the drawing. Therefore, the first scan signal GW transmitted to the 1-1 scan line SL1a may be transmitted as a third scan signal to the seventh thin-film transistor of the different pixel circuit PC4. Likewise, the third scan line SL3 may be electrically connected to the second thin-film transistor of a different pixel circuit PC4 that is adjacent to a lower side of the pixel circuit PC4 of FIG. 13 in the second direction shown in the drawing. Therefore, the third scan signal GB transmitted to the third scan line SL3 may be transmitted to a second thin-film transistor of the different pixel circuit PC4 as the first scan signal.

Figure 15:
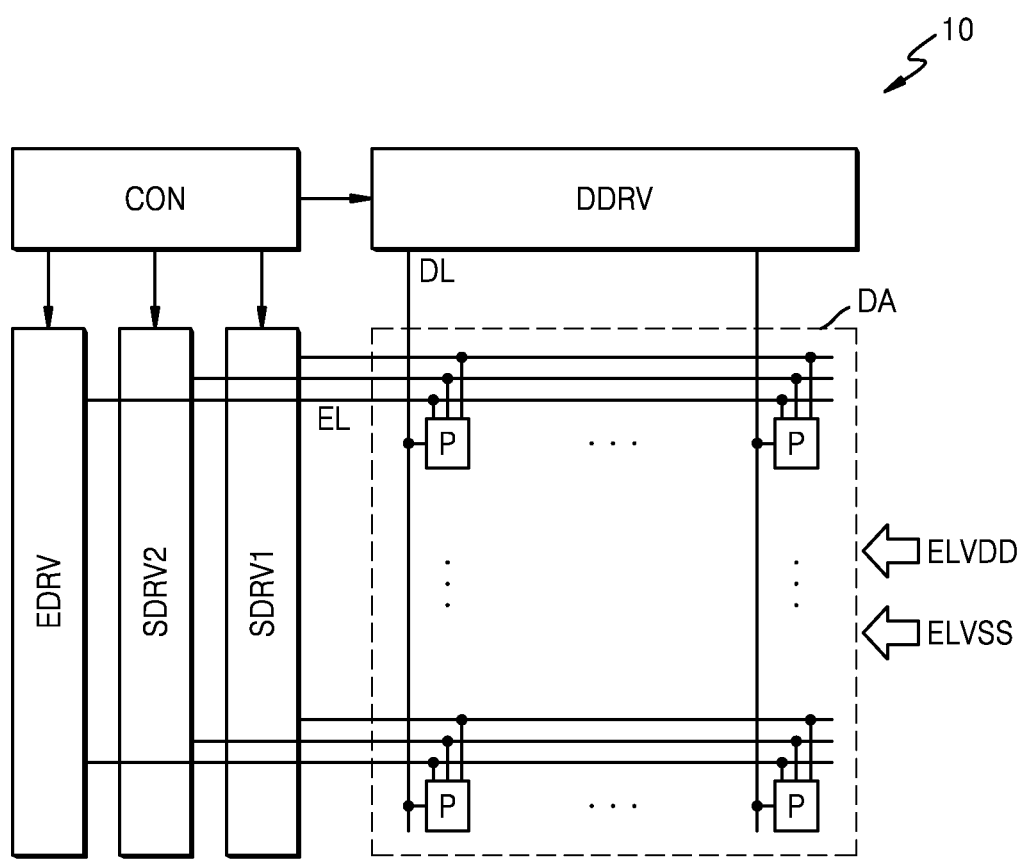
FIG. 15 is a schematic plan view illustrating a display panel according to an exemplary embodiment of the disclosure.

FIG. 15 is a schematic plan view of a display panel according to an exemplary embodiment of the inventive concept.

Referring to FIG. 15, pixels P may be arranged in the display area DA of the display panel 10. The pixels P may be arranged in various forms such as a stripe arrangement, a Pentile arrangement, and a mosaic arrangement, and thus images may be displayed. Each pixel P may include an organic light-emitting diode OLED as a display element, and the organic light-emitting diode OLED may be connected to a pixel circuit. Each pixel P may emit, for example, red light, green light, blue light or white light from the organic light-emitting diode OLED.

In the display area DA, first to fourth scan lines, emission control lines, first and second initialization voltage lines may be spaced apart from one another and arranged in a row direction. Also, in the display area DA, data lines and driving voltage lines may be spaced apart from one another and arranged in a column direction.

First and second scan driving circuits SDRV1 and SDRV2, an emission control driving circuit EDRV, and a data driving circuit DDRV may be disposed outside the display area DA. The first and second scan driving circuits SDRV1 and SDRV2 are connected to the first to fourth scan lines and transmit scan signals. The emission control driving circuit EDRV is connected to the emission control lines EL and transmits emission control signals. The data driving circuit DDRV is connected to the data lines DL and transmit data signals. Main voltage lines (not shown) for providing the initialization voltage Vint, the driving voltage ELVDD, and the common voltage ELVSS may be further disposed outside the display area DA.

The first scan driving circuit SDRV1 may be connected to the scan lines connected to gate electrodes of thin-film transistors of pixels P of the display area DA that are turned on according to a first voltage. The second scan driving circuit SDRV2 may be connected to the scan lines connected to gate electrodes of thin-film transistors of pixels P of the display area DA that are turned on according to a second voltage. The first voltage may be a voltage having a high level, and the second voltage may be an inverted voltage of the first voltage, that is, a voltage having a low level.

In an embodiment, the pixel P is the pixel P2 of FIG. 5, the first scan driving circuit SDRV1 may be connected to the first to third scan lines SL1 to SL3, and the second scan driving circuit SDRV2 may be connected to the fourth scan line SL4.

In an embodiment, the pixel P is the pixel P3 of FIG. 9, the first scan driving circuit SDRV1 may be connected to the first to third scan lines SL1 to SL3, and the second scan driving circuit SDRV2 may be connected to the fourth scan line SL4.

In an embodiment, the pixel P is the pixel P4, the first scan driving circuit SDRV1 may be connected to the first scan line SL1' and the third scan line SL3, and the second scan driving circuit SDRV2 may be connected to the second scan line SL2' and the fourth scan line SL4.

A controller CON (e.g., a control circuit) may receive input control signals for controlling an input image data from an external graphic controller (not shown) and a display of the image data. The controller CON may generate a control signal in response to an input control signal and may transmit the generated control signal to the first scan driving circuit SDRV1, the second scan driving circuit SDRV2, the emission control driving circuit EDRV and data driving circuit DDRV.

The first scan driving circuit SDRV1, the second scan driving circuit SDRV2, and the emission control driving circuit EDRV may be directly disposed on the substrate. The data driving circuit DDRV may be disposed on a flexible Printed circuit board (FPCB) electrically connected to pads that are disposed on one side of the substrate. In an exemplary embodiment, the data driving circuit DDRV is directly disposed on the substrate in a Chip on Glass (COG) manner or a Chip on Plastic (COP) manner.

As described above, according to at least one exemplary embodiment of the disclosure, the appearance of afterimages may be prevented, and thus, a display device may provide higher quality images.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the present disclosure.

What is claimed is:

1. A pixel comprising:
   a driving transistor comprising a gate electrode, a first terminal, and a second terminal;
   a first transistor connected between a data line and the first terminal of the driving transistor where a gate electrode of the first transistor is connected to a first scan line; and
   a second transistor connected between the gate electrode and the second terminal of the driving transistor,
   wherein the second transistor comprises:
   a first sub-transistor comprising a first gate electrode receiving a first scan signal from the first scan line having a first voltage level during a first period, a first terminal, and a second terminal; and
   a second sub-transistor connected to the first sub-transistor in parallel and comprising a second gate electrode receiving a second scan signal having a second voltage level that is an inversion of the first voltage level during the first period, a first terminal, and a second terminal,
   wherein the second terminal of the first sub-transistor and the second terminal of the second sub-transistor are connected to a node connected to the second terminal of the driving transistor, and
   wherein the node is located between the driving transistor and an emission control transistor that is connected to an organic-light emitting diode,
   wherein the first transistor, the first sub-transistor and the second sub-transistor are turned-on simultaneously, and the organic-light emitting diode does not emit light in the first period, and
   wherein the first transistor, the first sub-transistor and the second sub-transistor are turned-off simultaneously, and the organic-light emitting diode emits light in a second period following the first period.

2. The pixel of claim 1, wherein the first sub-transistor is a P-channel thin-film transistor, and the second sub-transistor is an N-channel thin-film transistor.

3. The pixel of claim 1, further comprising:
   a first scan line transmitting the first scan signal to the first sub-transistor and connected to the first sub-transistor; and
   a second scan line transmitting the second scan signal to the second sub-transistor and connected to the second sub-transistor, wherein the first and second scan lines extend in parallel with the driving transistor therebetween.

4. The pixel of claim 1, further comprising:
   a first node electrode connecting the first terminal of the first sub-transistor and the gate electrode of the driving transistor to each other; and a second node electrode connecting the first terminal of the second sub-transistor and the gate electrode of the driving transistor to each other.

5. The pixel of claim 4, further comprising a capacitor overlapping the driving transistor.

6. The pixel of claim 4, further comprising a driving voltage line, wherein the data line and the driving voltage line are disposed on a same layer as the first node electrode.

7. The pixel of claim 4, wherein the driving transistor is a P-channel thin-film transistor.

8. The pixel of claim 1, wherein each of the first sub-transistor and the second sub-transistor comprises a semiconductor layer comprising silicon.

9. The pixel of claim 1, wherein the first sub-transistor comprises a semiconductor layer comprising silicon, and the second sub-transistor comprises a semiconductor layer comprising an oxide.

10. The pixel of claim 9, further comprising a third transistor connected between the gate electrode of the driving transistor and an initialization voltage line.

11. The pixel of claim 10, wherein the third transistor comprises a semiconductor layer comprising an oxide.

12. A pixel comprising:
a driving transistor comprising a gate electrode, a first terminal, and a second terminal;
a first transistor connected between a data line and the first terminal of the driving transistor where a gate electrode of the first transistor is connected to a first scan line; and
a second transistor connected between the gate electrode and the second terminal of the driving transistor,
wherein the second transistor comprises:
a first sub-transistor comprising a first gate electrode receiving a first scan signal from the first scan line having a first voltage level during a first period and a second gate electrode receiving a second scan signal having a second voltage level that is an inversion of the first voltage level during the first period; and
a second sub-transistor connected to the first sub-transistor in series, and the second sub-transistor comprising a third gate electrode receiving the first scan signal from the first scan line, a first electrode, and a second electrode connected to a node located between the driving transistor and an emission control transistor that is connected to an organic-light emitting diode,
wherein the first transistor, the first sub-transistor and the second sub-transistor are turned-on simultaneously, and the organic-light emitting diode does not emit light in the first period, and
wherein the first transistor, the first sub-transistor and the second sub-transistor are turned-off simultaneously, and the organic-light emitting diode emits light in a second period following the first period.

13. The pixel of claim 12, further comprising:
a first scan line connected to the first gate electrode of the first sub-transistor and the third gate electrode of the second sub-transistor; and
a second scan line connected to the second gate electrode of the first sub-transistor.

14. The pixel of claim 13, wherein the second gate electrode is disposed on a lower layer of the first gate electrode, and the third gate electrode is disposed on a same layer as the first gate electrode.

15. The pixel of claim 12, further comprising a capacitor overlapping the driving transistor.

16. The pixel of claim 12, further comprising:
a node electrode connecting a first terminal of the second transistor and the gate electrode of the driving transistor to each other; and
a driving voltage line,
wherein the data line and the driving voltage line are disposed on a same layer as the node electrode.

17. A display device comprising a plurality of pixels, wherein each of the plurality of pixels comprises:
a driving transistor comprising a gate electrode, a first terminal and a second terminal;
a first transistor connected between a data line and the first terminal of the driving transistor where a gate electrode of the first transistor is connected to a first scan line; and
a second transistor connected between the gate electrode and the second terminal of the driving transistor,
wherein the second transistor comprises:
a first sub-transistor comprising a first gate electrode receiving a first scan signal from the first scan line having a first voltage level during a first period, a first terminal, and a second terminal; and
a second sub-transistor comprising a second gate electrode receiving a second scan signal having a second voltage level that is an inversion of the first voltage level during the first period, a first terminal, and a second terminal,
wherein the second terminal of the first sub-transistor and the second terminal of the second sub-transistor are connected a node connected to the second terminal of the driving transistor,
and
wherein the node is located between the driving transistor and an emission control transistor that is connected to an organic-light emitting diode,
wherein the first transistor, the first sub-transistor and the second sub-transistor are turned-on simultaneously, and the organic-light emitting diode does not emit light in the first period, and
wherein the first transistor, the first sub-transistor and the second sub-transistor are turned-off simultaneously, and the organic-light emitting diode emits light in a second period following the first period.

18. The display device of claim 17, wherein the first sub-transistor and the second sub-transistor are connected in parallel, the first sub-transistor is a P-channel thin-film transistor, and the second sub-transistor is an N-channel thin-film transistor.

19. The display device of claim 18, wherein the first sub-transistor comprises a semiconductor layer comprising silicon, and the second sub-transistor comprises a semiconductor layer comprising an oxide.

* * * * *